United States Patent
Shimomura et al.

(10) Patent No.: US 7,943,414 B2
(45) Date of Patent: May 17, 2011

(54) METHOD FOR MANUFACTURING SOI SUBSTRATE

(75) Inventors: Akihisa Shimomura, Kanagawa (JP); Hideto Ohnuma, Kanagawa (JP); Junpei Momo, Kanagawa (JP); Shunpei Yamazaki, Tokyo (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 12/512,141

(22) Filed: Jul. 30, 2009

(65) Prior Publication Data

US 2010/0029058 A1 Feb. 4, 2010

(30) Foreign Application Priority Data

Aug. 1, 2008 (JP) ................. 2008-200001
Aug. 1, 2008 (JP) ................. 2008-200016

(51) Int. Cl.
H01L 21/00 (2006.01)
H01L 21/30 (2006.01)
H01L 21/46 (2006.01)
H01L 21/36 (2006.01)
H01L 21/20 (2006.01)

(52) U.S. Cl. .......... 438/58; 438/143; 438/458; 438/480; 438/481; 438/509; 257/E21.561; 257/E21.563; 257/E21.564; 257/E21.567; 257/E21.568

(58) Field of Classification Search ........... 257/E21.561, 257/E21.563, E21.564, E21.567, E21.568
See application file for complete search history.

(56) References Cited

U.S. PATENT DOCUMENTS

| 5,374,564 | A | 12/1994 | Bruel |
| 5,643,826 | A | 7/1997 | Ohtani et al. |
| 5,923,962 | A | 7/1999 | Ohtani et al. |
| 6,117,700 | A | 9/2000 | Orita et al. |
| 6,285,042 | B1 | 9/2001 | Ohtani et al. |
| 6,335,231 | B1 | 1/2002 | Yamazaki et al. |
| 6,335,541 | B1 | 1/2002 | Ohtani et al. |
| 6,380,046 | B1 | 4/2002 | Yamazaki |
| 6,444,506 | B1 | 9/2002 | Kusumoto et al. |

(Continued)

FOREIGN PATENT DOCUMENTS

EP 0 651 431 5/1995

(Continued)

OTHER PUBLICATIONS

Kawaguchi et al., English Machine Translated of JP Publication No. 2005-252244, Oct. 5, 2001 (Machine Translated Jan. 6, 2011).*

(Continued)

Primary Examiner — Charles D Garber
Assistant Examiner — Mohsen Ahmadi
(74) Attorney, Agent, or Firm — Eric J. Robinson; Robinson Intellectual Property Law Office, P.C.

(57) ABSTRACT

An object of an embodiment of the present invention to be disclosed is to prevent oxygen from being taken in a single crystal semiconductor layer in laser irradiation even when crystallinity of the single crystal semiconductor layer is repaired by irradiation with a laser beam; and to make substantially equal or reduce an oxygen concentration in the semiconductor layer after the laser irradiation comparing before the laser irradiation. A single crystal semiconductor layer which is provided over a base substrate by bonding is irradiated with a laser beam, whereby the crystallinity of the single crystal semiconductor layer is repaired. The laser irradiation is performed under a reducing atmosphere or an inert atmosphere.

29 Claims, 13 Drawing Sheets

U.S. PATENT DOCUMENTS

| | | | |
|---|---|---|---|
| 6,534,380 B1 | 3/2003 | Yamauchi et al. | |
| 6,611,005 B2 | 8/2003 | Tsujimura et al. | |
| 6,677,222 B1 | 1/2004 | Mishima et al. | |
| 6,803,264 B2 | 10/2004 | Yamazaki et al. | |
| 6,803,296 B2 | 10/2004 | Miyairi | |
| 6,998,639 B2 | 2/2006 | Ohtani et al. | |
| 7,052,943 B2 | 5/2006 | Yamazaki et al. | |
| 7,119,365 B2 | 10/2006 | Takafuji et al. | |
| 7,153,729 B1 | 12/2006 | Yamazaki et al. | |
| RE39,484 E | 2/2007 | Bruel | |
| 7,199,024 B2 | 4/2007 | Yamazaki | |
| 7,253,032 B2 | 8/2007 | Yamazaki et al. | |
| 7,485,586 B2 | 2/2009 | Yamazaki et al. | |
| 7,579,654 B2 | 8/2009 | Couillard et al. | |
| 7,714,251 B2 | 5/2010 | Miyairi | |
| 2002/0022348 A1* | 2/2002 | Sakaguchi et al. | 438/480 |
| 2002/0109144 A1 | 8/2002 | Yamazaki | |
| 2002/0137265 A1 | 9/2002 | Yamazaki et al. | |
| 2004/0147095 A1 | 7/2004 | Yamazaki | |
| 2005/0009252 A1 | 1/2005 | Yamazaki et al. | |
| 2006/0131583 A1 | 6/2006 | Ohtani et al. | |
| 2006/0278876 A1 | 12/2006 | Yamazaki et al. | |
| 2007/0117288 A1 | 5/2007 | Miyairi | |
| 2007/0173000 A1 | 7/2007 | Yamazaki | |
| 2007/0184632 A1 | 8/2007 | Yamazaki et al. | |
| 2008/0054269 A1 | 3/2008 | Yamazaki et al. | |
| 2008/0061301 A1 | 3/2008 | Yamazaki | |
| 2008/0067529 A1 | 3/2008 | Yamazaki | |
| 2008/0067596 A1 | 3/2008 | Yamazaki et al. | |
| 2008/0067597 A1 | 3/2008 | Yamazaki | |
| 2008/0070335 A1 | 3/2008 | Yamazaki et al. | |
| 2008/0083953 A1 | 4/2008 | Yamazaki | |
| 2008/0113487 A1 | 5/2008 | Yamazaki et al. | |
| 2008/0113488 A1 | 5/2008 | Yamazaki et al. | |
| 2008/0286911 A1 | 11/2008 | Miyairi | |
| 2008/0299743 A1 | 12/2008 | Miyairi | |
| 2008/0315350 A1 | 12/2008 | Tanaka | |
| 2009/0004821 A1 | 1/2009 | Shimomura et al. | |
| 2009/0029525 A1 | 1/2009 | Ohnuma | |
| 2009/0093102 A1 | 4/2009 | Moriwaka | |
| 2009/0098710 A1 | 4/2009 | Yamazaki | |
| 2009/0115029 A1 | 5/2009 | Koyama et al. | |
| 2009/0117680 A1 | 5/2009 | Yamazaki et al. | |
| 2009/0142874 A1 | 6/2009 | Arai | |
| 2009/0142879 A1* | 6/2009 | Isaka et al. | 438/96 |
| 2009/0142908 A1* | 6/2009 | Isaka et al. | 438/481 |
| 2009/0269875 A1* | 10/2009 | Kato et al. | 438/58 |

FOREIGN PATENT DOCUMENTS

| | | |
|---|---|---|
| EP | 1 158 580 | 11/2001 |
| JP | 05-211128 | 8/1993 |
| JP | 11-097379 | 4/1999 |
| JP | 11-163363 | 6/1999 |
| JP | 2005-252244 | 9/2005 |

OTHER PUBLICATIONS

Zehner, D. et al., "Preparation of Atomically Clean Silicon Surfaces by Pulsed Laser Irradiation," Appl. Phys. Lett. (Applied Physics Letters), vol. 36, No. 1, Jan. 1980, pp. 56-59.

* cited by examiner

FIG. 2A1
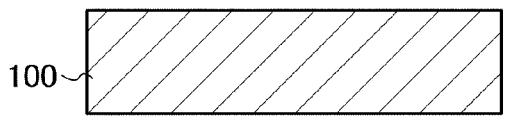
FIG. 2A2
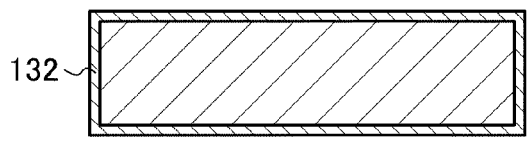
FIG. 2A3
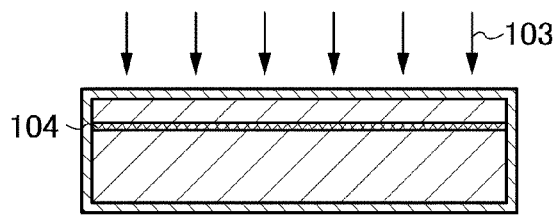
FIG. 2B1
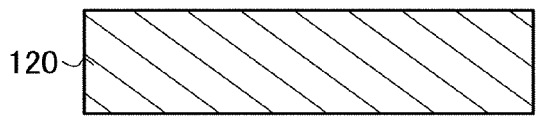
FIG. 2B2
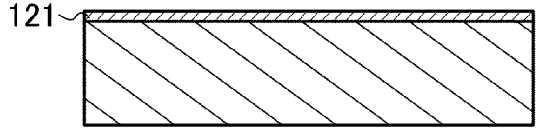
FIG. 2C
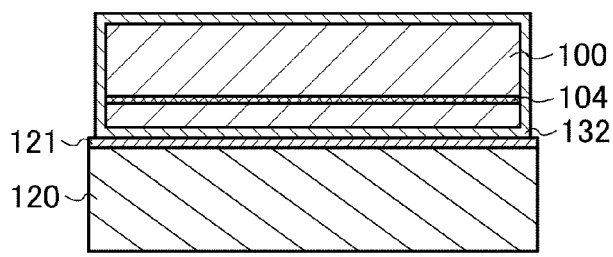
FIG. 2D
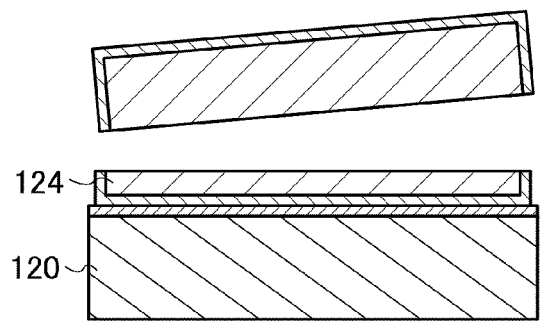

METHOD FOR MANUFACTURING SOI SUBSTRATE

BACKGROUND OF THE INVENTION

1. Field of the Invention

The present invention relates to a method for manufacturing a substrate provided with a semiconductor layer with an insulating layer interposed therebetween. In particular the present invention relates to a method for manufacturing an SOI (silicon on insulator) substrate. In addition, the present invention relates to a method for manufacturing a semiconductor device using a substrate provided with a semiconductor layer with an insulating layer interposed therebetween.

2. Description of the Related Art

In recent years, integrated circuits using an SOI substrate where a thin single crystal semiconductor layer is formed on an insulating surface, instead of a bulk silicon wafer, have been developed. Since parasitic capacitance between a drain of a transistor and a substrate is reduced by using the SOI substrate, the SOI substrate has attracted attention as one improving performance of semiconductor integrated circuits.

One of known methods for manufacturing SOI substrates is a Smart Cut (registered trademark) method (for example, see Patent Document 1). An outline of the method for manufacturing an SOI substrate by a Smart Cut method is described below. First, hydrogen ions are implanted into a silicon wafer by an ion-implantation method to form a microbubble layer at a predetermined depth from the surface. Then, the silicon wafer into which the hydrogen ions are implanted is bonded to another silicon wafer with a silicon oxide film interposed therebetween. Then, by heat treatment, the microbubble layer functions as a cleavage plane and a part of the silicon wafer into which hydrogen ions have been implanted is separated in a thin film shape along the microbubble layer. Accordingly, a single crystal silicon film can be formed over the other bonded silicon wafer. A Smart Cut method may also be referred to as a hydrogen-ion-implantation-separation method.

In addition, a method has also been proposed in which a single crystal silicon layer is formed over a base substrate formed of glass by such a Smart Cut method (for example, see Patent Document 2). Since glass substrates can have a larger area and are less expensive than silicon wafers, the glass substrates are mainly used for manufacturing liquid crystal display devices and the like. By using such a glass substrate as a base substrate, a large-sized inexpensive SOI substrate can be manufactured.

Further, a method for irradiating a single crystal silicon layer with a laser beam in order to improve the crystal quality of the single crystal silicon layer is disclosed in Patent Document 2.

REFERENCE

[Patent Document 1] Japanese Published Patent Application No. H05-211128.
[Patent Document 2] Japanese Published Patent Application No. 2005-252244.

As described in Patent Document 2, even when a low-heat-resistance substrate such as a glass substrate is used, a single crystal semiconductor is melted by irradiating the single crystal semiconductor layer with a laser beam, so that the crystallinity thereof can be improved. However, in the case where any treatment is not performed in the laser irradiation, oxygen in an atmosphere is taken in the semiconductor layer, whereby there is a possibility that characteristics of an element in which the single crystal semiconductor layer is used is adversely affected.

For example, silicon widely used for an industry, which is manufactured by a czochralski (CZ) method, includes a predetermined amount of oxygen in advance. When silicon includes a great amount of oxygen, there is a possibility that the oxygen adversely affects characteristics of an element such as a transistor or the like; therefore, in some cases, the silicon is used after the oxygen concentration in the silicon is reduced to an extent that the oxygen in the silicon does not adversely affect the element characteristics. Even slight increasing of the oxygen concentration in the silicon affects characteristics of an element if using such silicon. Therefore, increase in the oxygen concentration during a manufacturing process is a serious problem.

In addition, the oxygen in silicon becomes precipitate of silicon oxide by heat treatment and then a secondarily defect is further grown. Therefore, as the oxygen concentration in the silicon becomes lower, the characteristics of the element are improved since defects formed later are reduced; therefore, it is preferable that the oxygen concentration in the silicon can be reduced in a manufacturing process.

SUMMARY OF THE INVENTION

In view of the aforementioned problem, an object of an embodiment of the present invention to be disclosed is to prevent oxygen from being taken in a single crystal semiconductor layer in laser irradiation even when the crystallinity of the single crystal semiconductor layer is repaired by irradiation with a laser beam; and to make substantially equal or reduce the oxygen concentration in the single crystal semiconductor layer before and after the laser irradiation. Another object of an embodiment of the present invention to be disclosed is to reduce the oxygen concentration of a single crystal semiconductor layer provided over a base substrate.

An embodiment of the present invention to be disclosed includes the following steps: a single crystal semiconductor layer provided over a base substrate by bonding is irradiated with a laser beam and the crystallinity of the single crystal semiconductor layer is repaired (recrystallized). The laser irradiation is performed under a reducing atmosphere or an inert atmosphere.

According to an embodiment of the present invention to be disclosed, a single crystal semiconductor substrate is irradiated with accelerated ions to form an embrittlement region in the single crystal semiconductor substrate; the single crystal semiconductor substrate and a base substrate are bonded together with an insulating layer interposed therebetween; the single crystal semiconductor substrate is separated at the embrittlement region to form a single crystal semiconductor layer over the base substrate with the insulating layer interposed therebetween; a surface of the single crystal semiconductor layer is irradiated with a laser beam under a reducing atmosphere to melt at least a surface portion of the single crystal semiconductor layer; and the single crystal semiconductor layer is recrystallized.

According to another embodiment of the present invention to be disclosed, a single crystal semiconductor substrate is irradiated with accelerated ions to form an embrittlement region in the single crystal semiconductor substrate; the single crystal semiconductor substrate and a base substrate are bonded together with an insulating layer interposed therebetween; the single crystal semiconductor substrate is separated at the embrittlement region to form a single crystal semiconductor layer over the base substrate with the insulating layer interposed therebetween; a surface of the single crystal semiconductor layer is irradiated with a laser beam in a chamber which is subjected to deoxidation treatment and set to a reducing atmosphere to melt at least a surface portion of the single crystal semiconductor layer; and the single crystal semiconductor layer is recrystallized.

According to another embodiment of the present invention to be disclosed, a single crystal semiconductor substrate is irradiated with accelerated ions to form an embrittlement region in the single crystal semiconductor substrate; the single crystal semiconductor substrate and a base substrate are bonded together with an insulating layer interposed therebetween; the single crystal semiconductor substrate is separated at the embrittlement region to form a single crystal semiconductor layer over the base substrate with the insulating layer interposed therebetween; a surface of the single crystal semiconductor layer is irradiated with a laser beam in a chamber which is subjected to deoxidation treatment and set to a high-purity inert atmosphere to melt at least a surface portion of the single crystal semiconductor layer; and the single crystal semiconductor layer is recrystallized.

In the embodiment of the present invention to be disclosed, a hydrogen atmosphere, a mixed atmosphere including hydrogen and a rare gas, a mixed atmosphere including hydrogen and nitrogen, or a mixed atmosphere including hydrogen, a rare gas and nitrogen can be employed for the reducing atmosphere. A nitrogen atmosphere or an argon atmosphere can be employed for the inert atmosphere. At this time, an impurity in a gas is preferably removed with the use of a gas refining apparatus. Note that the atmosphere in the chamber may be a reduced pressure atmosphere. Further, treatment using a silane gas or a hydrogen gas is preferably performed on the chamber as the deoxidation treatment.

In the embodiment of the present invention to be disclosed, the melting of the single crystal semiconductor layer by the laser irradiation is preferably partial melting. Note that it is important to prevent increase in an oxygen concentration in the single crystal semiconductor layer before and after the laser irradiation.

In the embodiment of the present invention to be disclosed, it is preferable that the oxygen concentration in the single crystal semiconductor layer after the laser irradiation is less than $1 \times 10^{18}$ atoms/cm$^3$. In order to realize this, the oxygen concentration in the high-purity inert atmosphere may be less than 100 ppt.

In the embodiment of the present invention to be disclosed, a double chamber can be used as the chamber. Further, when a single crystal silicon substrate subjected to heat treatment at 1000° C. to 1250° C. inclusive under a reducing atmosphere is used for the single crystal semiconductor substrate, whereby the oxygen concentration in the single crystal semiconductor layer can be further reduced.

In this specification, the single crystal means a crystal in which crystal axis directions are the same directions in any portion of a sample when attention is paid to a certain crystal axis and which does not have a crystal grain boundary. Note that, in this specification, the single crystal includes a crystal in which the crystal axes directions are uniform as described above and which has no grain boundaries even when it includes a crystal defect or a dangling bond. In addition, re-single-crystallization of a single crystal semiconductor layer means that a semiconductor layer having a single crystal structure returns to a single crystal structure after being in a different state from the single crystal structure (for example, a liquid-phase state). In addition, it can be said that re-single-crystallization of a single crystal semiconductor layer means that a single crystal semiconductor layer is recrystallized to form a single crystal semiconductor layer.

Note that a semiconductor device in this specification generally indicates a device capable of functioning by utilizing semiconductor characteristics, and electro-optic devices, semiconductor circuits, and electronic devices are all semiconductor devices.

In addition, in this specification, a display device includes a light-emitting device and a liquid crystal display device. The light-emitting device includes a light-emitting element, and the liquid crystal display device includes a liquid crystal element. A light-emitting element includes, in its category, an element whose luminance is controlled by current or voltage. Specifically, a light-emitting element includes an inorganic EL (electroluminescence) element, an organic EL element, and the like.

According to an embodiment of the present invention to be disclosed, by irradiation with a laser beam under a reducing atmosphere or an inert atmosphere, oxygen can be prevented from being taken in the single crystal semiconductor layer in the laser irradiation step and increase in the concentration of oxygen included in the single crystal semiconductor layer after the laser irradiation comparing before the laser irradiation can be suppressed.

BRIEF DESCRIPTION OF THE DRAWINGS

FIGS. 2A1 to 2D illustrate an example of a method for manufacturing an SOI substrate.

Figure 1A:
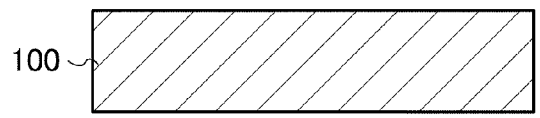
FIGS. 1A to 1E illustrate an example of a method for manufacturing an SOI substrate.

Hereinafter, embodiments of the present invention are described with reference to the drawings. However, the present invention can be implemented in various different modes, and it is to be easily understood that various changes and modifications in modes and details thereof will be apparent to those skilled in the art without departing from the meaning and the scope of the present invention. Therefore, the present invention should not be interpreted as being limited to the description of the embodiments given below. Through the drawings of the embodiments, the same components or components having the same functions are denoted by the same reference numerals and will not be further explained.

EMBODIMENT 1

In this embodiment, an example of a method for manufacturing an SOI substrate is described with reference to drawings. In particular, a process in which a single crystal semiconductor layer is formed over a base substrate using a Smart Cut (registered trademark) method with an insulating layer interposed therebetween and then crystallinity of the single crystal semiconductor layer is repaired is described.

Figure 1B:
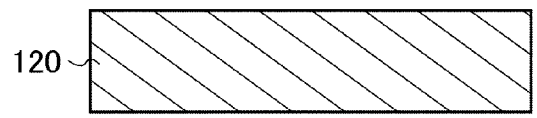
Figure 1C:
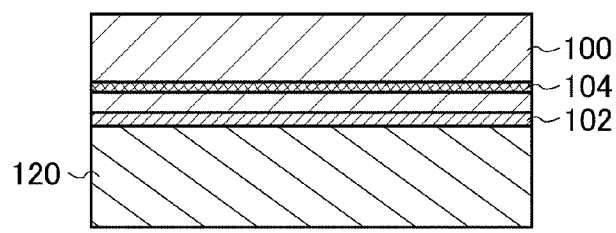

First, a single crystal semiconductor substrate 100 and a base substrate 120 are prepared (see FIGS. 1A and 1B).

As the single crystal semiconductor substrate 100, a single crystal semiconductor substrate that is formed of a group IV element, such as a single crystal silicon substrate, a single crystal germanium substrate, a single crystal silicon germanium substrate, or the like can be used. Alternatively, a compound semiconductor substrate formed of gallium arsenide, indium phosphide, or the like may be used. The size of a commercial silicon substrate is typically 5 inches (125 mm) in diameter, 6 inches (150 mm) in diameter, 8 inches (200 mm) in diameter, 12 inches (300 mm) in diameter, and 16 inches (400 mm) in diameter, and a typical shape thereof is a circular shape. Note that the shape of the single crystal semiconductor substrate 100 is not limited to a circular shape; for example, a single crystal semiconductor substrate processed into a rectangular shape or the like can also be used. Further, the single crystal semiconductor substrate 100 can be manufactured employing a CZ method or a FZ (floating zone) method. In the description given below, a case where a single crystal silicon substrate manufactured employing a CZ method is used as the single crystal semiconductor substrate 100 is described.

As the base substrate 120, a substrate formed of an insulator can be used. In specific, a variety of glass substrates that are used in the electronics industry, such as aluminosilicate glass substrates, aluminoborosilicate glass substrates, and barium borosilicate glass substrates; quartz substrates; ceramic substrates; and sapphire substrates can be given. Besides, as the base substrate 120, a single crystal semiconductor substrate (for example, a single crystal silicon substrate or the like) may be used. In this embodiment, a case of using a glass substrate is described. With the use of a glass substrate that can have a large area and is inexpensive as the base substrate 120, a cost can be reduced.

Next, an embrittlement region 104 where a crystal structure is damaged is formed at a predetermined depth from a surface of the single crystal semiconductor substrate 100 and then the single crystal semiconductor substrate 100 and the base substrate 120 are bonded together with an insulating layer 102 interposed therebetween (see FIG. 11C).

The embrittlement region 104 can be formed by irradiating the single crystal semiconductor substrate 100 with ions such as hydrogen having kinetic energy.

The insulating layer 102 can be formed of a single layer using an insulating film such as a silicon oxide film, a silicon oxynitride film, a silicon nitride film, and a silicon nitride oxide film, or a stacked layer thereof. These films can be formed by a thermal oxidation method, a CVD method, a sputtering method, or the like.

In this specification, silicon oxynitride includes more oxygen than nitrogen, and in the case where measurements are conducted using Rutherford backscattering spectrometry (RBS) and hydrogen forward scattering (HFS), silicon oxynitride preferably includes oxygen, nitrogen, silicon, and hydrogen at concentrations ranging from 50 to 70 at. %, 0.5 to 15 at. %, 25 to 35 at. %, and 0.1 to 10 at. %, respectively. Further, silicon nitride oxide includes more nitrogen than oxygen, and in the case where measurements are conducted using RBS and HFS, silicon nitride oxide preferably includes oxygen, nitrogen, silicon, and hydrogen at concentrations ranging from 5 to 30 at. %, 20 to 55 at. %, 25 to 35 at. %, and 10 to 30 at. %, respectively. Note that percentages of nitrogen, oxygen, silicon, and hydrogen fall within the ranges given above, where the total number of atoms contained in the silicon oxynitride film or the silicon nitride oxide film is defined as 100 at. %.

Figure 1D:
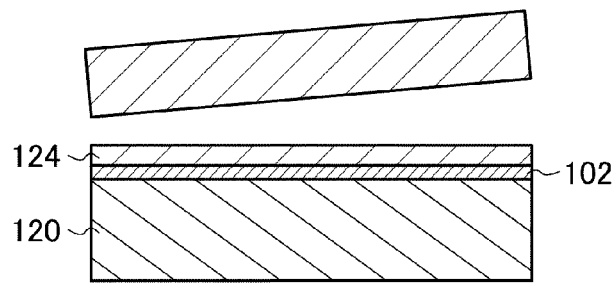

Next, heat treatment is performed and separation (cleavage) is generated at the embrittlement region 104, so that a single crystal semiconductor layer 124 is formed over the base substrate 120 with the insulating layer 102 interposed therebetween (see FIG. 1D).

When the heat treatment is performed, the element added is deposited to microvoids which are formed in the embrittlement region 104 by elevation of the temperature, and then the internal pressure is increased. The microvoids in the embrittlement region 104 are changed in volume by increase in the pressure, and a crack is generated in the embrittlement region 104. Thus, the single crystal semiconductor substrate 100 is cleaved along the embrittlement region 104. Since the insulating layer 102 is bonded to the base substrate 120, the single crystal semiconductor layer 124 which has been separated from the single crystal semiconductor substrate 100, is formed over the base substrate 120.

Figure 1E:
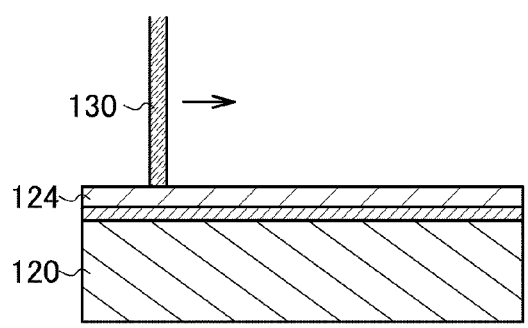

Next, a surface of the single crystal semiconductor layer 124 formed over the base substrate 120 is irradiated with a laser beam 130 under a reducing atmosphere or an inert atmosphere, whereby crystallinity of the single crystal semiconductor layer 124 is repaired (recrystallized) (see FIG. 1E).

In general, the crystallinity is damaged at a surface portion of the single crystal semiconductor layer 124 formed over the base substrate 120 after the cleavage because crystal defects and the like are generated due to the formation of the embrittlement region 104, the cleavage at the embrittlement region 104, and the like. Therefore, as illustrated in FIG. 1E, the surface of the single crystal semiconductor layer 124 is irradiated with the laser beam 130 to melt at least the surface portion of the single crystal semiconductor layer 124, whereby the crystallinity can be repaired. Note that the crystallinity of the single crystal semiconductor layer 124 can be evaluated by observation with an optical microscope, Raman shift and a full width at half maximum which are obtained from a Raman spectroscopy spectrum, or the like.

In this embodiment, it is preferable that the single crystal semiconductor layer 124 is melted not completely but partially (partial melting) by performing irradiation with the laser beam 130 from the surface side of the single crystal semiconductor layer 124 exposed by the separation. "Partial melting" means that a depth of the melted portion of the single crystal semiconductor layer 124 by irradiation with the laser beam 130 is shallower than that of an interface of the insulating layer 102 (the thickness of the single crystal semiconductor layer 124). That is, this state indicates that the upper layer of the single crystal semiconductor layer 124 is melted and is in a liquid phase and a lower layer thereof is a solid-phase single crystal semiconductor without being melting.

With the partial melting of the single crystal semiconductor layer 124, crystals at the part melted by the irradiation with the laser beam 130 grow in accordance with a plane direction of the non-melted part of the single crystal semiconductor layer; therefore, recrystallization can be performed with the plane direction aligned as compared with the case of complete melting. Further, when the single crystal semiconductor layer 124 is partly melted, oxygen, nitrogen and the like can be prevented from being taken from the insulating layer 102.

In this embodiment, the irradiation with the laser beam 130 is performed under a reducing atmosphere or an inert atmosphere. Oxygen included in the atmosphere can be prevented from being taken in the single crystal semiconductor layer 124 by the irradiation under a reducing atmosphere or an inert atmosphere, even when the single crystal semiconductor layer 124 is irradiated with the laser beam 130 to be melted. As a result, increase in a concentration of oxygen included in the single crystal semiconductor layer 124 can be suppressed before and after the irradiation step with the laser beam 130. Further, when a reducing atmosphere is employed, it is also possible to reduce the oxygen concentration.

As the reducing atmosphere, a hydrogen atmosphere, a mixed atmosphere of a hydrogen gas and a rare gas, a mixed atmosphere of a hydrogen gas and a nitrogen gas, or a mixed atmosphere of a hydrogen gas, a rare gas, and a nitrogen gas is employed. As the rare gas, at least one of helium, neon, argon, krypton, and xenon can be used. In order to make the reducing atmosphere, the aforementioned gases are selected as appropriate and introduced to a chamber in which the laser irradiation step is performed.

As the inert atmosphere, a nitrogen atmosphere, a rare gas atmosphere, a mixed atmosphere of a nitrogen gas and a rare gas, or the like can be employed. As the rare gas, at least one of helium, neon, argon, krypton, and xenon can be used. In order to make the inert atmosphere, the aforementioned gas is selected as appropriate and introduced to a chamber in which the laser irradiation step is performed. Further, the partial pressure of oxygen in the chamber is set to be extremely small (preferably, less than $1 \times 10^{-20}$ atm) in the inert atmosphere, whereby reduction action can be obtained.

In addition, when these gases are introduced, impurities in the aforementioned gas is removed using a gas refining apparatus (purification apparatus), whereby the oxygen concentration in the atmosphere can be further reduced.

Alternatively, the irradiation with the laser beam 130 may be performed employing a reduced-pressure atmosphere as the atmosphere in the chamber. With a reduced-pressure atmosphere, the oxygen concentration in the atmosphere can be further reduced.

In addition, in this embodiment, in order to prevent oxygen from being taken and increasing in the single crystal semiconductor layer 124 after the irradiation step with the laser beam 130 comparing before the irradiation step, it is preferable that the oxygen concentration in the chamber is set to less than 1 ppb; preferably less than 100 ppt; more preferably less than 1 ppt. The oxygen concentration in the reducing atmosphere or the inert atmosphere is reduced as low as possible, whereby oxygen can be prevented form being taken in the single crystal semiconductor layer 124 in the laser irradiation step and increase in the concentration of oxygen included in the single crystal semiconductor layer 124 can be suppressed. Further, when the reducing atmosphere is employed, it is also possible to reduce the oxygen concentration.

In this specification, among the inert atmospheres, the atmosphere whose oxygen concentration is reduced sufficiently such as less than 1 ppb as described above is particularly referred to as a high-purity inert atmosphere.

In addition, in this embodiment, the concentration of oxygen included at least in the melted part of the single crystal semiconductor layer 124 after the irradiation step with the laser beam 130 is preferably less than $1 \times 10^{18}$ atoms/cm$^3$, more preferably less than $5 \times 10^{17}$ atoms/cm$^3$.

Note that the oxygen concentration in the chamber can be measured by measuring an exhausted gas with a sensor capable of measuring an oxygen concentration. For example, the oxygen concentration in the chamber can be obtained by measuring the partial pressure of oxygen using an oxygen sensor manufactured by ST lab corporation (SiOS-200P). Further, the oxygen concentration in the single crystal semiconductor layer 124 can be measured by SIMS (secondary ion mass spectroscopy).

Note that in order to reduce the concentration of oxygen included in the single crystal semiconductor layer 124 after the irradiation with the laser beam 130 (for example, reduce to the aforementioned value), deoxidation treatment may be performed in advance on the single crystal semiconductor substrate 100 used for bonding (see FIG. 1A). In particular, the single crystal silicon which is manufactured by employing a CZ method has a predetermined concentration of oxygen ($5 \times 10^{17}$ atoms/cm$^3$ to $3 \times 10^{19}$ atoms/cm$^3$); therefore, deoxidation treatment is preferably performed thereon. The deoxidation treatment, for example, can be performed by heating the single crystal semiconductor substrate 100 at a high temperature (for example, 1000° C. to 1250° C., inclusive) under a reducing atmosphere including hydrogen. In addition, it is preferable that the oxygen concentration in the single crystal semiconductor substrate 100 used for bonding is reduced to less than $1 \times 10^{18}$ atoms/cm$^3$, more preferably less than $1 \times 10^{17}$ atoms/cm$^3$. Needless to say, a substrate which has been deoxidized in advance may be used for the single crystal semiconductor substrate 100.

As a laser oscillator which can be used in this embodiment, a laser oscillator whose oscillation wavelength is in the range from the ultraviolet region to the visible light region is selected. The wavelength of the laser light 130 is set to have a wavelength which is absorbed by the single crystal semiconductor layer 124. The wavelength can be determined in consideration of the skin depth of the laser beam and the like. For example, the wavelength can be in the range of 250 nm to 700 nm, inclusive.

As the laser oscillator, a pulsed laser or a continuous wave laser (a CW laser) can be used. For example, in the case of a pulsed laser, a repetition rate of less than 10 MHz, and a pulse width of 10 nanoseconds to 500 nanoseconds inclusive are preferably employed. A typical pulsed laser is an excimer laser that emits a laser beam having a wavelength of 400 nm or less. As the aforementioned excimer laser, for example, an XeCl excimer laser having a repetition rate of 10 Hz to 300 Hz, a pulse width of 25 nanoseconds, and a wavelength of 308 nm can be used. In addition, in scanning with the pulsed laser beam, one shot and the following shot may be partially overlapped with each other. By partially overlapping one shot with the following shot in laser irradiation, refining of single crystals partially is performed repeatedly, whereby a single crystal semiconductor layer having excellent characteristics can be obtained.

Further, the range of the energy density of the laser beam to partially melt the single crystal semiconductor layer 124 is set to such an energy density that the single crystal semiconductor layer 124 is not completely melted, in consideration of the wavelength of the laser beam, the skin depth thereof, the thickness of the single crystal semiconductor layer 124 and the like. For example, when the thickness of the single crystal semiconductor layer 124 is large, the energy necessary for completely melting the single crystal semiconductor layer 124 is also large, and thus the range of the energy density of the laser beam can be set to be wide. When the thickness of the single crystal semiconductor layer 124 is small, the energy necessary for completely melting the single crystal semiconductor layer 124 is also small, and thus the energy density of the laser beam is preferably set to be small. Note that when the single crystal semiconductor layer 124 is irradiated with the laser beam while being heated, the upper limit of the range of the energy density necessary for partially melting is preferably set to be small because completely melting the single crystal semiconductor layer 124 can be prevented. In addition, when irradiation with the laser beam is performed while heating is performed, it is possible to remove moisture and the like which are attached to the single crystal semiconductor layer.

In addition, cleaning treatment (deoxidation treatment) is preferably performed before the laser irradiation in order to prevent oxygen from being taken in the single crystal semiconductor layer 124 in the irradiation with the laser beam 130. As examples of the cleaning treatment, treatment with a silane gas, treatment with a hydrogen gas and the like can be given. Here, treatment with a silane gas and treatment with a hydrogen gas are referred to as silane flushing and hydrogen flushing, respectively (also collectively referred to as flushing treatment in some case), each of which is performed by flushing a predetermined amount of a reactive gas for a predetermined time.

By the aforementioned cleaning treatment, a concentration of oxygen remaining in the chamber can be reduced sufficiently. This is because the introduced gas reacts to the oxygen remaining in the camber and then the product resulting from the reaction is discharged to the outside of the chamber together with the aforementioned gas. For example, the oxygen in the chamber can be removed effectively when monosilane ($SiH_4$) is kept being introduced into the chamber at a flow rate of 8 SLM (standard liter per minute) to 10 SLM inclusive for 5 minutes to 20 minutes inclusive, preferably 10 minutes to 15 minutes inclusive. Here, 1 SLM equals 0.06 $m^3$/h.

Note that it is more effective to perform the cleaning treatment after cleaning treatment with the use of fluorine radical, for example. Fluorine radical can be generated by dissociation of fluorine or the like which is introduced to a plasma generator provided outside the chamber or the like.

By employing the method described in this embodiment, oxygen can be prevented from being taken in a single crystal semiconductor layer in the irradiation step with a laser beam even when the single crystal semiconductor layer formed over a base substrate is melted by irradiation with the laser beam and then crystallinity thereof is repaired. Similarly, other impurities such as carbon and the like can be prevented from being taken in the single crystal semiconductor layer.

In addition, by performing plasma treatment on the surface of the single crystal semiconductor layer 124 under an atmosphere containing a hydrogen gas before the laser irradiation, impurities (including carbon, nitrogen, oxygen, and the like) which are attached to the surface of the single crystal semiconductor layer 124 may be removed.

When the oxygen concentration in the single crystal semiconductor layer 124 is high, there is a high probability that condensed silicon oxide exists in the single crystal semiconductor layer 124. When the condensed silicon oxide is generated in a channel region or the like in a transistor, variation in characteristics of the transistor (the S value, off current, threshold value, mobility, and the like) may be caused. Therefore, by reducing the oxygen concentration in the single crystal semiconductor layer 124, influence on characteristics of an element such as a transistor including the single crystal semiconductor layer 124 can be reduced. In particular, part of the single crystal semiconductor layer 124 whose crystallinity is repaired by the laser irradiation is used for a channel formation region or the like of a transistor in many cases; therefore, as described above, it is important to prevent oxygen form being taken in the single crystal semiconductor layer 124 in the laser irradiation step.

Note that the structure described in this embodiment can be implemented by being combined as appropriate with any one of structures described in other embodiments in this specification.

EMBODIMENT 2

In this embodiment, an apparatus capable of irradiating a single crystal semiconductor layer formed over a base substrate with a laser beam (a laser irradiation apparatus) is described with reference to drawings. In particular, the case where a double chamber is used as an example of a method for controlling an atmosphere at the time of irradiation with laser beam is described with reference to FIG. 3.

Figure 3:
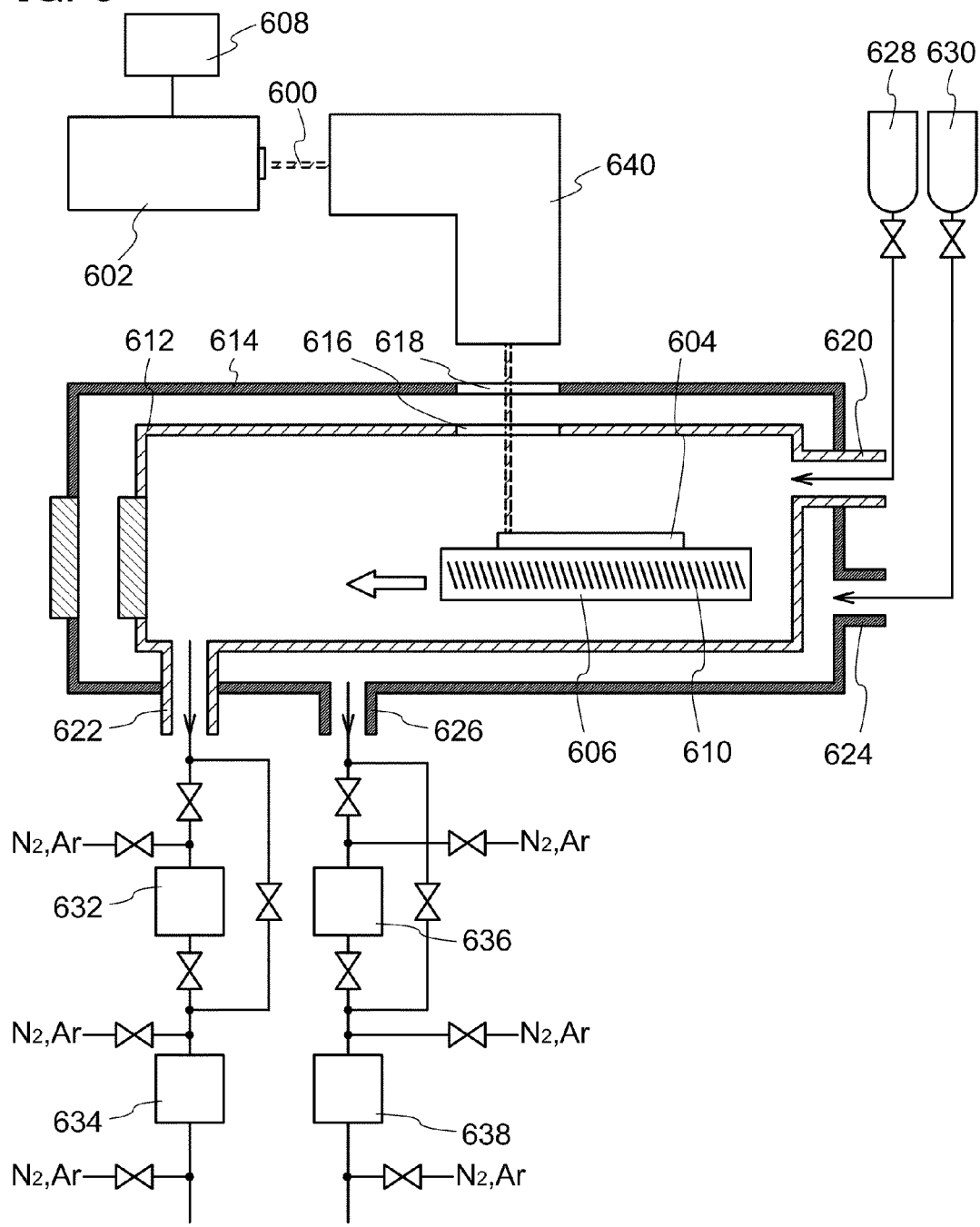
FIG. 3 illustrates an example of a laser irradiation apparatus used in a method for manufacturing an SOI substrate.

The laser irradiation apparatus described in this embodiment includes a laser oscillator 602 for emitting a laser beam 600 and a stage 606 over which a processing substrate 604 is set (see FIG. 3). A controller 608 is connected to the laser oscillator 602. By the control of the controller 608, energy of the laser beam 600 emitted from the laser oscillator 602, repetition rate, and the like can be changed. Further, a heating means 610 such as a resistance heating device is provided in the stage 606 so as to heat the processing substrate 604.

The stage 606 is provided inside an inner side chamber 612. In addition, the inner side chamber 612 is provided inside an outer side chamber 614. The stage 606 is provided so as to be able to move in the above chamber.

Windows 616 and 618 for introducing the laser beam 600 to the processing substrate 604 are provided in respective parts of walls of the inner chamber 612 and the outer chamber 614. The window 616 and the window 618 each are formed using a material, such as quartz, whose transmittance with respect to the laser beam 600 is high. In order to increase the transmittance with respect to the laser beam 600 as high as possible, it is preferable that the window 616 and the window 618 are thinly formed.

In order to control an atmosphere in the inner chamber 612, a gas supply port 620 and an exhaust port 622 are provided in the inner chamber 612. Further, in order to control an atmosphere in the outer chamber 614, a gas supply port 624 and an exhaust port 626 are provided in the outer chamber 614.

In this embodiment, at least the atmosphere of the inner chamber 612 is set to a reducing atmosphere or an inert atmosphere. In addition, the atmosphere of the outer chamber 614 is preferably set to a reducing atmosphere or an inert atmosphere. In this manner, by employing the double chamber, even when oxygen enters from the outside of the chamber, the oxygen is suppressed by the outer chamber 614; therefore, an oxygen concentration in the inner chamber can be effectively reduced. As a result, oxygen can be prevented from being taken in the single crystal semiconductor layer in the laser irradiation step.

Each of the gas supply port 620 and the gas supply port 624 is provided with a gas supply device 628 or a gas supply device 630 through a valve. Here, the gas supply device 628 and the gas supply device 630 both are provided; however, in the case where provision of one gas supply device is enough to supply a gas, for example, when the same gas is supplied, one gas supply device can be used in common.

The exhaust port 622 and the exhaust port 626 are each provided with an independent exhaust system. Specifically, the exhaust port 622 is provided with a turbo pump 632 and a dry pump 634 through valves; the exhaust port 626 is provided with a turbo pump 636 and a dry pump 638 through valves. In addition, the exhaust port 622 and the dry pump 634 (the exhaust port 626 and the dry pump 638) are connected to each other through the valves, and therefore, rough vacuum can be performed by the dry pump.

In addition, an inert gas such as nitrogen or argon preferably flows to an exhaust line while a flow rate thereof is controlled. By making flow an inert gas whose flow rate is controlled to the exhaust line, reverse diffusion of a contaminant material from the exhaust line into the treatment chamber can be suppressed.

An optical system 640 including a lens, a mirror, or the like is set between the laser oscillator 602 and the stage 606. The optical system 640 is provided outside the outer chamber 614. The energy distribution of the laser beam 600 from the laser oscillator 602 is uniformed by the optical system 640, and the cross-sectional shape thereof is processed into a linear shape or a rectangular shape. The laser beam 600 which have passed through the optical system 640 passes through the window 618 and the window 616, enters the inside of the inner chamber 612, and is delivered on the processing substrate 604 over the stage 606. At this time, by moving the stage 606, irradiation with the laser beam 600 can be performed on the entire surface of the processing substrate 604.

The laser oscillator 602 and the optical system 640 may be moved. Alternatively, the processing substrate 604 may be moved while the laser oscillator 602 or the optical system 640 is moved. When the processing substrate 604 is moved while the laser oscillator 602 or the optical system 640 is moved, the processing substrate 604 is moved in a direction different from that in which the laser oscillator 602 or the optical system 640 is moved (for example, one is moved in an X axis direction and the other is moved in a Y axis direction that differs from X axis by 90°), whereby efficient laser irradiation can be performed.

When the processing substrate 604 is irradiated with the laser beam 600, the processing substrate 604 may be heated by the heating means 610 of the stage 606. The single crystal semiconductor layer is irradiated with the laser beam while being heated, whereby moisture is prevented from being taken in the single crystal semiconductor layer. Further, a gas selected as appropriate from a hydrogen gas, a nitrogen gas, a rare gas and the like is supplied from the gas supply port 620 and the gas supply port 624, whereby the irradiation with the laser beam 600 can be performed under a reducing atmosphere.

Here, in order to sufficiently reduce an oxygen concentration in the atmosphere at the time of the laser irradiation, a structure in which oxygen from the outside does not enter at least the inside of the inner chamber 612 is needed. To realize this structure, for example, a pressure outside the chamber, a pressure inside the outer chamber 614, and a pressure inside the inner chamber 612 are set to P, $P_o$ and $P_i$, respectively, where the following relation may be satisfied: $P_o < P_i$. Alternatively, the following relation may be possible: $P < P_o$. With such a relation between the pressure outside the chamber and the pressure inside the chamber, a gas outside the chamber can be sufficiently prevented from entering the inside of the inner chamber 612.

In this embodiment, the method for sufficiently reducing the oxygen concentration of the atmosphere in the laser irradiation with the use of the laser irradiation apparatus having the double-chamber structure is described. By employing the structure as described in this embodiment, for example, the oxygen concentration of the laser irradiation atmosphere can be set to less than 1 ppb, preferably less than 100 ppt, more preferably less than 1 ppt. Accordingly, laser irradiation can be performed in an atmosphere whose oxygen concentration is sufficiently reduced. In addition, by applying the laser irradiation apparatus described in this embodiment, impurities such as carbon and the like can be prevented form being taken in the single crystal semiconductor layer.

Note that in this embodiment, the supply ports of the double chamber of the inner chamber 614 and the outer chamber 612 are formed separately from the exhaust ports; however, the present invention is not limited thereto. The inner chamber and the outer chamber are formed as the double chamber. A shutter capable of opening and closing may be provided between the inner chamber and the outer chamber and inner chamber and the outer chamber may be provided with the common exhaust port.

Note that the structure described in this embodiment can be implemented by being combined as appropriate with any one of structures described in other embodiments in this specification.

EMBODIMENT 3

In this embodiment, specific structures of a laser irradiation apparatus are described in more detail with reference to drawings.

In this embodiment, examples of a laser irradiation apparatus whose laser irradiation prevents contamination of a single crystal semiconductor layer are described. In a positive manner, examples of a laser irradiation apparatus suitable for reduction (deoxidation) of an oxygen concentration in the single crystal semiconductor layer is described. Therefore, the laser irradiation apparatus according to this embodiment is structured so that an oxygen concentration in a treatment chamber in which a sample is kept can be reduced as low as possible in laser irradiation.

Laser irradiation is performed together with treatment in which the single crystal semiconductor layer is melted temporary (instantly); therefore, when a treatment atmosphere is not cleaned, the single crystal semiconductor layer takes in impurities. Even if the single crystal semiconductor layer is formed using a high-refined semiconductor substrate, the single crystal semiconductor layer takes in impurities by laser irradiation, so that improvement in performance of a semiconductor element such as a transistor cannot be realized. Since a single crystal semiconductor such as a single crystal semiconductor layer is sensitively influenced by an impurity, control of an atmosphere in laser irradiation is important in terms of process management.

Here, when the cause of the contamination in the laser irradiation is checked up, the followings can be considered: (1) an impurity segregated from an inner wall of the treatment chamber (the chamber); (2) a process gas or an impurity introduced into the treatment chamber by flow of the process gas through a gas pipe; (3) an impurity taken in due to reaction of a process gas (radical) which has been activated at the time of laser irradiation in the treatment chamber (for example, the material obtained in such a manner that the radial reacts to an impurity adhering to the inner wall of the treatment chamber and liberated into the treatment chamber). As typical examples of the impurity adversely affecting the single crystals semiconductor layer, moisture, oxygen, nitrogen, carbon dioxide, hydrocarbon, and the like can be considered. Such impurities are taken in the single crystal semiconductor layer, whereby the single crystal semiconductor layer is oxidized, nitrided, or carbonized; as a result, electric characteristics of the transistor or the like are deteriorated.

Against such a contaminant source, the laser irradiation apparatus according to this embodiment is structured so that reduction of a residual gas in the treatment chamber and refinement of a process gas can be effectively performed. The details thereof are described below with reference to drawings.

Figure 11:
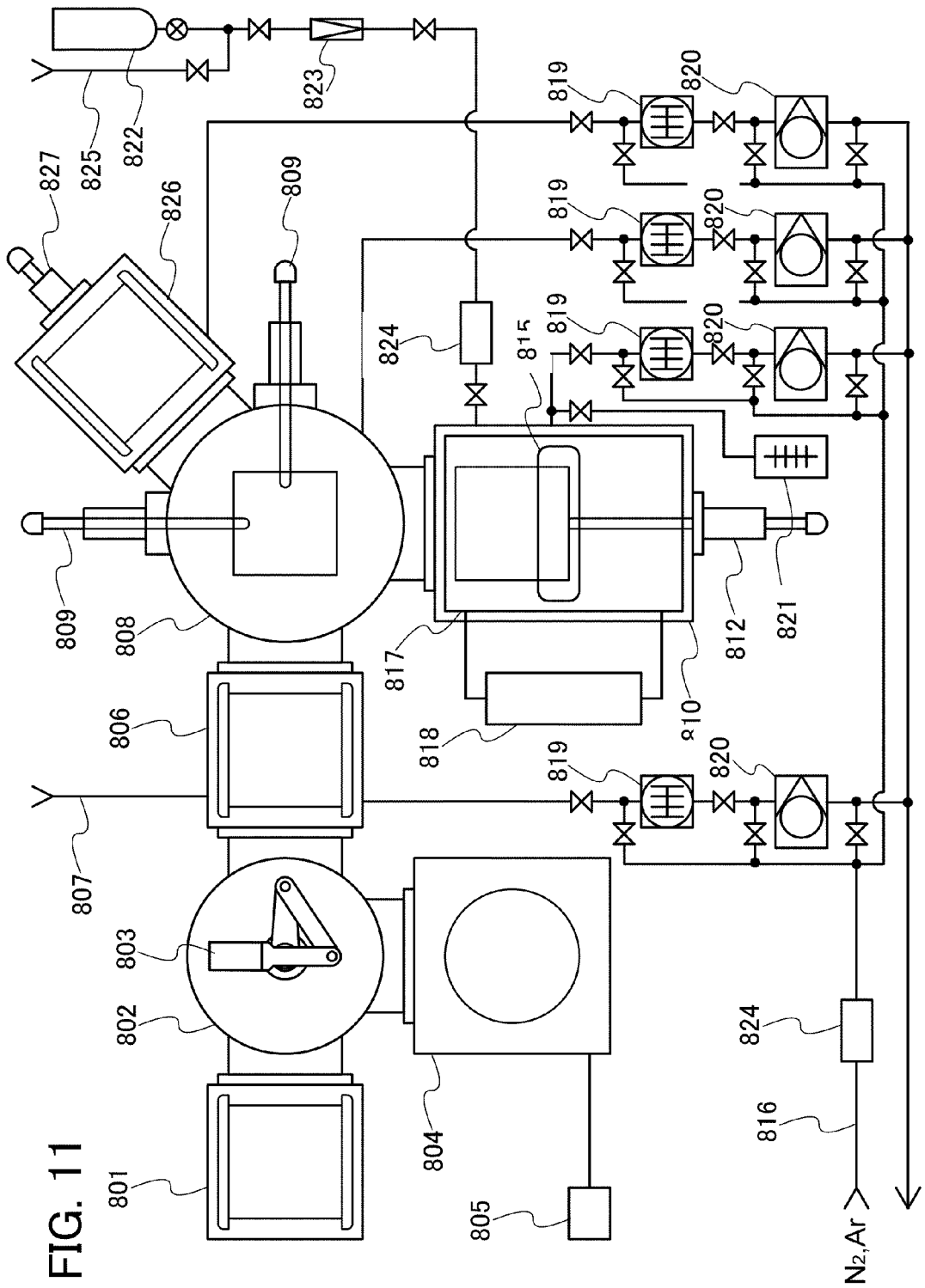
FIG. 11 illustrates an example of a laser irradiation apparatus used in a method for manufacturing an SOI substrate.

FIG. 11 illustrates a structure of the laser irradiation apparatus according to this embodiment. In this laser irradiation apparatus, a substrate set in a load chamber 801 can be processed without being exposed to the air through the following steps: the substrate set in the load chamber 801 is transferred to a treatment chamber 810 via a surface treatment chamber 804, and the substrate is irradiated with a laser beam and then taken out from an unload chamber 826. In particular, in the treatment chamber, a measure for preventing mixing of oxygen and the like is made so that the oxygen concentration of the single crystal semiconductor layer can be reduced together with planarization and recrystallization of the single crystal semiconductor layer provided over the substrate. The detailed description thereof is given below.

In the surface treatment chamber 804, treatment for removing a contaminant material attached to a surface of the single crystal semiconductor layer and the oxide film formed over the surface of the single crystal semiconductor layer is performed. This treatment is effective so that the contaminant material or the oxide film on the surface of the single crystal semiconductor is not taken in the single crystal semiconductor layer due to laser irradiation. An agent necessary for surface treatment of the single crystal semiconductor layer (for example, dilute fluorinated acid, ozone water or the like) is supplied from a treatment agent supply port 805. The surface treatment can be performed in a normal pressure (atmospheric pressure). The substrate provided with the single crystal semiconductor layer is transferred from the load chamber 801 to the surface treatment chamber 804 through a substrate transferring chamber 802 by a transfer arm 803.

A waiting chamber 806 is a place for keeping the substrate after the treatment of the surface treatment chamber 804. The substrate is transferred from the surface treatment chamber 804 to the waiting chamber 806 also by the transfer arm 803 of the substrate transferred chamber 802. A purge gas line 807 is provided in the waiting chamber 806 so that the waiting chamber 806 can be purged using a rare gas such as helium and argon or a nitrogen gas in order that the surface of the single crystal semiconductor layer which has been cleaned is not contaminated. Further, a turbomolecular pump 819 and a dry pump 820 are connected to the waiting chamber 806 so that vacuum exhaust can be performed. This is to facilitate transfer of the substrate so as to correspond to the treatment chamber 810 because a reduced-pressure state is kept therein. Further, the substrate can be kept in a vacuum in the waiting chamber 806; therefore, this structure also has an effect of preventing formation of a native oxide film on the surface of the single crystal semiconductor layer.

The waiting chamber 806 and the treatment chamber 810 are connected to each other with a substrate transfer chamber 808. The substrate kept in the waiting chamber 806 is transferred to the treatment chamber 810 by a transfer arm 809. The substrate transfer chamber 808 is connected to the turbomolecular pump 819 and the dry pump 820 so that the substrate is not contaminated during transfer. An oil-free vacuum exhaust system including the turbomolecular pump 819 and the dry pump 820 is effective at increasing cleaning level in the waiting chamber 806 and the substrate transfer chamber 808.

The oil-free vacuum system including the turbomolecular pump 819, a cryopump 821, and the dry pump 820 are also connected to the treatment chamber 810. A purge gas lime 816 connected between the turbomolecular pump 819 and the dry pump 820 is for introducing an inert gas. When a region between an exhaust side of a turbomolecular pump 819 and the dry pump 820 is a viscous flow region, a molecular of a gas exhausted by the turbomolecular pump 819 is moved by viscous flow and then exhausted by the dry pump 820; therefore, reverse diffusion of the exhausted gas toward the chamber can be prevented.

In addition, an inert gas such as nitrogen and argon is preferably made flow into the exhaust line while a flow rate thereof is controlled. By flow of an inert gas whose flow rate is controlled into the exhaust line, reverse diffusion of a contaminant material from the exhaust line into the treatment chamber can be suppressed.

A laser beam necessary for a laser irradiation step is introduced from a laser-beam-introducing window 815 and the substrate is moved in the treatment chamber 810 by the transfer arm 812, so that the entire surface of the substrate can be irradiated with the laser beam.

The treatment chamber 810 is covered with a wall the inside of which is hollow for the most part (a shroud 817). A fluid such as silicone oil is flowing through the shroud 817 and the temperature of the fluid is controlled at a shroud-temperature-controlling unit 818. In other words, the temperature of the inner wall of the treatment chamber 810 can be controlled by the shroud 817.

The gas introduced into the treatment chamber 810 is supplied from a cylinder 822. The flow rate of the gas is controlled by a flow-rate-controlling unit 823 and a gas refining apparatus 824 is connected to the gas line. The gas refining apparatus 824 is preferably provided in the vicinity of a gas supply port of the treatment chamber 810. The gas refining apparatus 824 includes a reaction tube filled with a chemical and a physical adsorbent, filters, valves, and the like. In the gas refining apparatus 824, an impurity in the gas is removed, whereby the purity of the gas to be supplied is improved. A purge gas line 825 purges a gas pipe using an inert gas and is used for purging the inside of the gas pipe when the cylinder 822 is exchanged.

The substrate which has been subjected to a laser irradiation step is collected to the unload chamber 826 by a transfer arm 827 via the substrate transfer chamber 808. As described in this embodiment, each chamber is connected to another chamber through the transfer chamber, whereby treatment necessary for laser irradiation can be performed without the substrate being exposed to the air.

Note that FIG. 11 illustrates one example of the laser irradiation apparatus; therefore, the structure thereof such as the surface treatment chamber and the transfer chamber can be modified as appropriate. Details of the treatment chamber according to this embodiment are described below.

Figure 12:
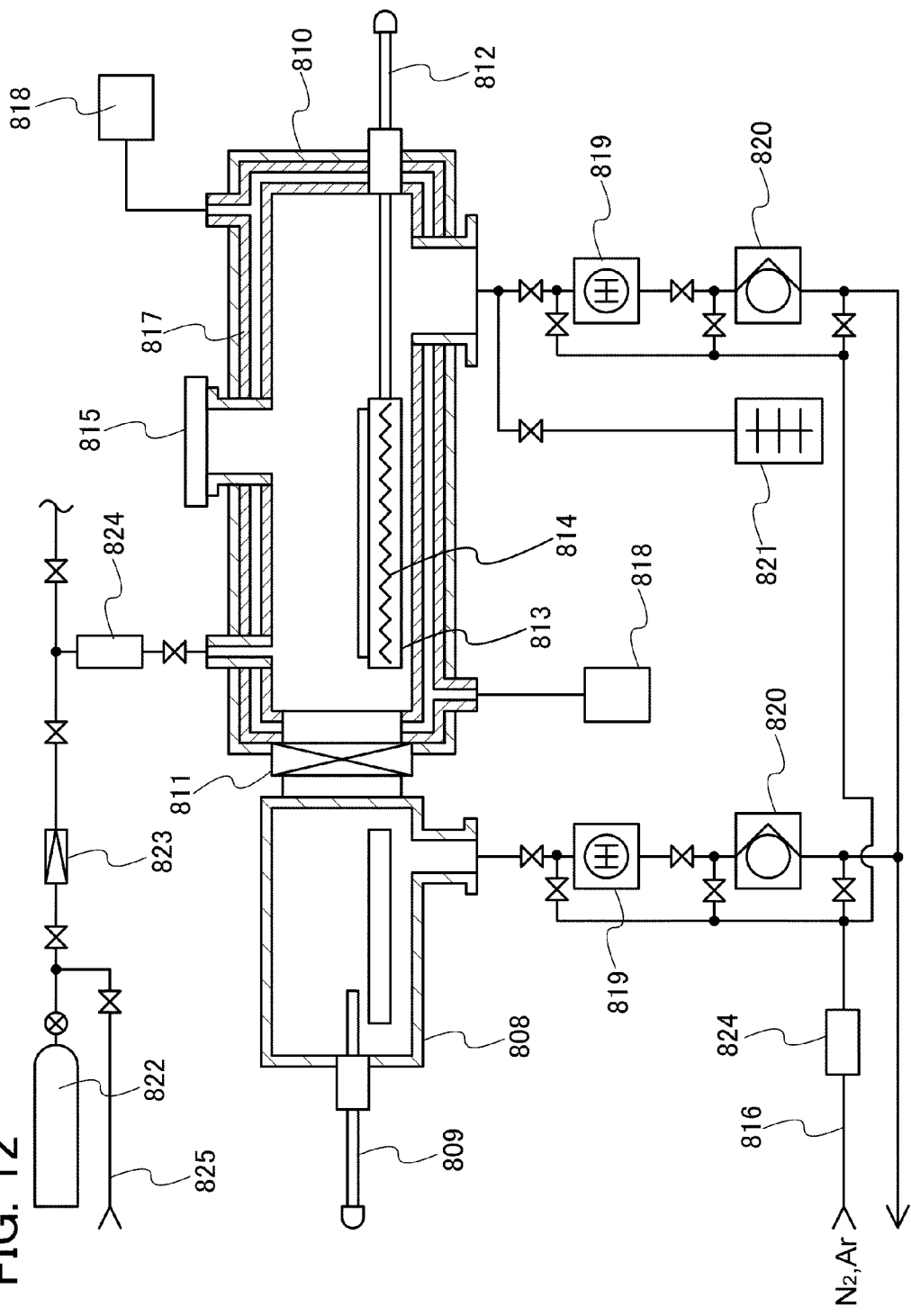
FIG. 12 illustrates an example of a laser irradiation apparatus used in a method for manufacturing an SOI substrate.

FIG. 12 illustrates the details of the treatment chamber 810 and the like. The treatment chamber 810 is connected to the substrate transfer chamber 808 through a gate valve 811. The vacuum exhaust systems of the treatment chamber 810 and the substrate transfer chamber 808 each include the turbomolecular pump 819 and the dry pump 820. The treatment chamber 810 is prevented from being contaminated by opening the gate valve 811. The vacuum exhaust system of the treatment chamber 810 is also provided with the cryopump 821. The cryopump captures gas molecules of the treatment chamber 810 by condensing and adsorbing them utilizing physical adsorption, whereby oil-free and clean vacuum can be obtained. In particular, use of the cryopump is effective in order to obtain ultrahigh vacuum of a pressure of lower than $10^{-5}$ Pa.

The substrate provided with the single crystal semiconductor layer is kept at a substrate stage 813. The laser beam with which irradiation is performed on the single crystal semiconductor layer passes through the laser-beam-introducing window 815 and then the substrate over the substrate stage 813 is irradiated with the laser beam. In order to perform the laser irradiation on the entire surface of the substrate, the substrate stage 813 can be moved at least in one axial direction by the transfer arm 812. As an accessory member, a heater 814 for heating the substrate may be provided in the substrate stage 813. The heating of the substrate by the heater 814 is effective at improving an effect of the laser irradiation step.

A process gas having high purity is originally supplied from the cylinder 822. The gas refining apparatus 824 can prevent the process gas from being decreased in purity by a little amount of the residual gas in the gas pipe. In order to increase effect of refining the gas, the gas refining apparatus 824 is preferably provided in the vicinity of the gas supply port of the treatment chamber 810. For example, when a molecular sieve is used as the gas refining apparatus 824, hydrogen chloride, carbon dioxide, sulfur dioxide, a chlorine gas and the like included in the process gas can be removed together with moisture included in the process gas. Further, oxygen as the impurity in the process gas can be removed using a metal solvent. In order to increase the purity of hydrogen as the process gas, a gas refining apparatus employing a hydrogen-separation method in which palladium alloy is used can be used. By using a plurality of refining apparatuses having different functions in combination as the gas refining apparatus 824, refining capacity can be increased.

The shroud 817 is provided inside the treatment chamber 810. The fluid such as silicone oil is flowing through the shroud 817. The fluid is heated to approximately 250° C. and cooled down to −30° C. by the shroud-temperature-controlling unit 818. By flowing the heated fluid through the shroud 817, a gas adsorbed onto the inner wall of the treatment chamber 810 can be detached. In other words, baking of the treatment chamber 810 can be performed and moisture which can become a contaminant material of the single crystal semiconductor layer can be removed effectively by using the cryopump 821. The shroud 817 can be provided in almost the whole area inside the treatment chamber 810. Therefore, uniform baking can be performed.

On the other hand, when the cooled fluid is flowing through the shroud 817 at the time of laser irradiation, the gas is prevented from being segregated from the inner wall. When the fluid is cooled to −30° C., an effect of trapping moisture and the like can be obtained. Accordingly, the amount of the residual impurity gas inside the treatment chamber 810 can be reduced. In addition, even when laser irradiation is performed in a reducing atmosphere, the process gas and the inner wall can be prevented from reacting to each other; therefore, an effect which is favorable for realizing refinement or deoxidation of the single crystal semiconductor layer can be obtained.

Figure 13:
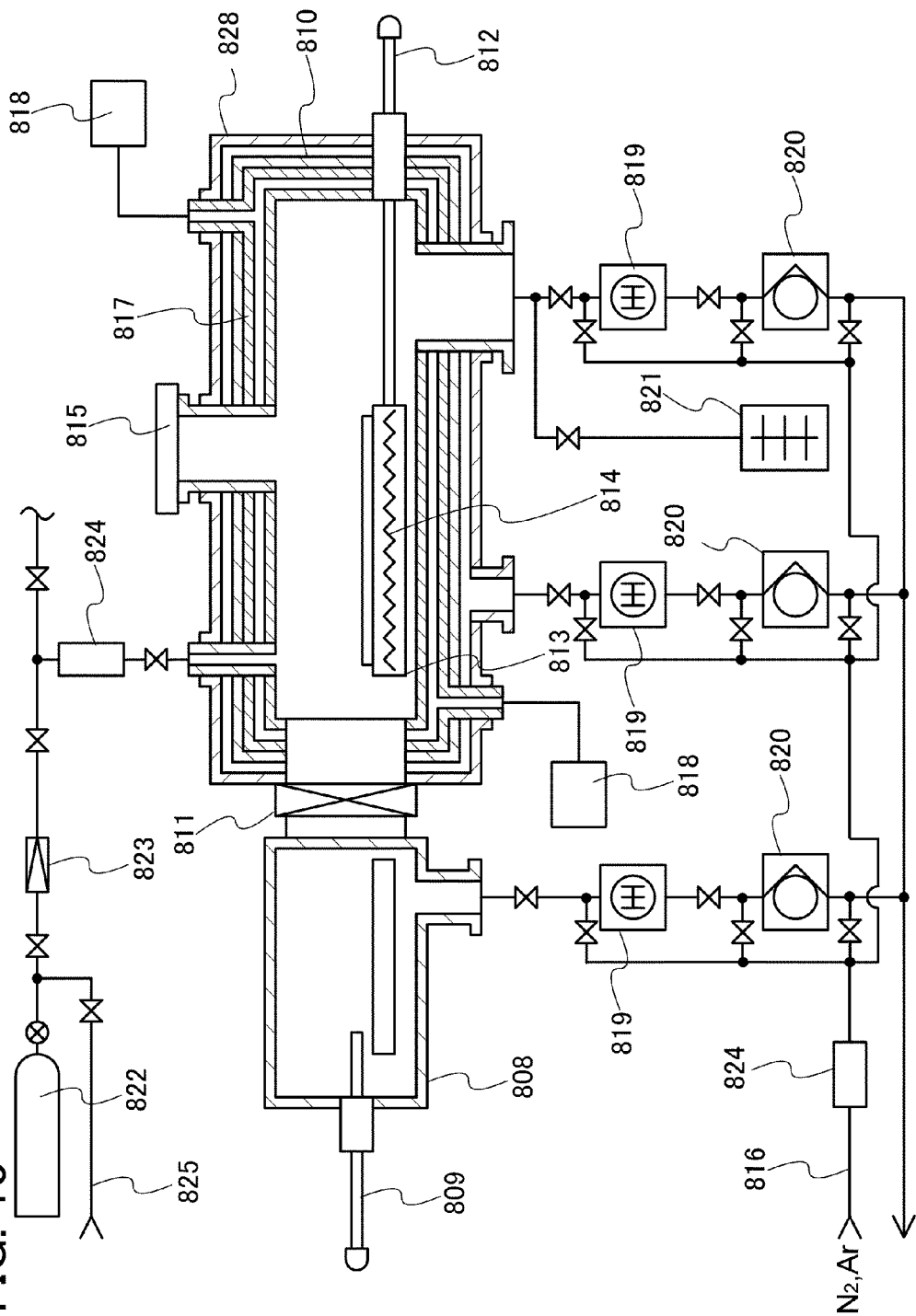
FIG. 13 illustrates an example of a laser irradiation apparatus used in a method for manufacturing an SOI substrate.

A laser irradiation apparatus of FIG. 13 includes an outer treatment chamber 828 outside the treatment chamber 810 in addition to the structure of the laser irradiation apparatus of FIG. 12. The outer treatment chamber 828 can be evacuated independently of the treatment chamber 810. By doubling the evacuation chamber (double chamber), air leaking to the chamber 810 to be mixed therein can be reduced and the amount of an impurity gas in the treatment chamber 810 can be reduced. Further, the outer treatment chamber 828 is insulated against heat by being evacuated, whereby an effect of heating or cooling the shroud 817 can be increased and power consumption can be reduced.

In this manner, with the use of the laser apparatuses illustrated in FIG. 12 and FIG. 13, laser irradiation can be performed without the substrate which is provided with the single crystal semiconductor layer being exposed to the air. Further, a residual impurity inside the treatment chamber can be reduced; therefore, the single crystal semiconductor layer is not only prevented from being oxidized caused by taking oxygen but also can be deoxidized in a positive manner. In addition, by applying the laser irradiation apparatus described in this embodiment, another impurity such as carbon can be prevented from being taken in the single crystal semiconductor layer.

Note that the structures described in this embodiment can be implemented by being combined as appropriate with any one structures described in other embodiments in this specification.

EMBODIMENT 4

In this embodiment, bonding of a single crystal semiconductor substrate 100 and a base substrate 120 is described with reference to drawings.

First, the single crystal semiconductor substrate 100 is prepared (see FIG. 2A1). Note that it is preferable that a surface of the single crystal semiconductor substrate 100 is cleaned in advance using a sulfuric acid/hydrogen peroxide mixture (SPM), an ammonium hydroxide/hydrogen peroxide mixture (APM), a hydrochloric acid/hydrogen peroxide mixture (HPM), dilute hydrogen fluoride (DHF), or the like as appropriate in terms of removal of contamination. Alternatively, cleaning may be performed by alternately discharging dilute hydrogen fluoride and water including ozone.

Next, an oxide film 132 is formed over the surface of the single crystal semiconductor substrate 100 (see FIG. 2A2).

The oxide film 132 can be formed using, for example, a single layer of a silicon oxide film or a silicon oxynitride film, or a stacked layer thereof. These films can be formed by a thermal oxidation method, a CVD method, a sputtering method, or the like. In addition, when the oxide film 132 is formed by a CVD method, a silicon oxide film formed by using organosilane such as tetraethoxysilane (abbreviation: TEOS, chemical formula: $Si(OC_2H_5)_4$) is used for the oxide film 132 in terms of productivity.

In this embodiment, thermal oxidation treatment is performed on the single crystal semiconductor substrate 100 to form the oxide film 132 (here, a SiOx film) (see FIG. 2A2). As thermal oxidation treatment, oxidation in an oxidation atmosphere to which halogen is added is preferably performed.

For example, the thermal oxidation treatment is performed on the single crystal semiconductor substrate 100 in an oxidation atmosphere to which chlorine (Cl) is added, whereby the oxide film 132 is formed through chlorine oxidation. In this case, the oxide film 132 is a film including a chlorine atom.

The chlorine atom included in the oxide film 132 causes distortion. As a result, moisture absorption rate of the oxide film 132 is increased and then the diffusion rate thereof is increased. Namely, when moisture exists over the oxide film 132, moisture over the surface of the oxide film 132 can be rapidly absorbed and diffused into the oxide film 132.

As one example of the thermal oxidation treatment, thermal oxidation can be performed in an oxidation atmosphere including hydrogen chloride (HCl) at 0.5 vol % to 10 vol % (preferably 2 vol %) with respect to oxygen, at a temperature of 900° C. to 1150° C. (typically, 1000° C.). Treatment time may be 0.1 to 6 hours, preferably 0.5 to 1 hour. The film thickness of the oxide film formed is 10 nm to 1000 nm (preferably, 50 nm to 300 nm), for example, 100 nm.

In this embodiment mode, the atmosphere is controlled so that the chlorine atom concentration included in the oxide film 132 is $1\times10^{17}$ atoms/cm$^3$ to $1\times10^{21}$ atoms/cm$^3$. When the chlorine atom is included in the oxide film 132, an effect that a heavy metal that is an extrinsic impurity (for example, Fe, Cr, Ni, Mo or the like) is captured so as to prevent contamination of the single crystal semiconductor substrate 100 can be obtained.

When halogen such as chlorine is included in the oxide film 132 by HCl oxidation, the oxide film 132 has an effect of gettering of an impurity adversely affecting to the single crystal semiconductor substrate (for example, movable ions such as ions of Na). That is, by heat treatment performed after formation of the oxide film 132, an impurity included in the single crystal semiconductor substrate is deposited to the oxide film 132 and reacts to halogen (for example, chlorine), so that the impurity is captured. Thus, the impurity captured in the oxide film 132 can be fixed and contamination of the single crystal semiconductor substrate 100 can be prevented. In addition, the oxide film 132 can function as a film for fixing the impurity included in glass such as Na in the case of bonding the oxide film 132 to a glass substrate.

In particular, inclusion of halogen such as chlorine in the oxide film 132 by HCl oxidation or the like is effective when the semiconductor substrate is not cleaned sufficiently or removal of contamination is performed on the semiconductor substrate which is reused plural times.

The halogen atom included in the oxide film 132 is not limited to a chlorine atom. A fluorine atom may be included in the oxide film 132. In order to perform fluorine oxidation on the surface of the single crystal semiconductor substrate 100, the following may be performed: the surface of the single crystal semiconductor substrate 100 is soaked in HF solution and then thermal oxidation is performed thereon in an oxidation atmosphere; thermal oxidation is performed on the single crystal semiconductor substrate 100 in an oxidation atmosphere to which $NF_3$ is added.

Next, an embrittlement region 104 whose crystal structure is damaged is formed in the single crystal semiconductor substrate 100 at a predetermined depth by irradiating the single crystal semiconductor substrate 100 with ions having kinetic energy (see FIG. 2A3). As illustrated in FIG. 2A3, by irradiating the single crystal semiconductor substrate 100 through the oxide film 132 with ions 103 that are accelerated, the ions 103 are added to a region at the predetermined depth from the surface of the single crystal semiconductor substrate 100, whereby the embrittlement region 104 can be formed. The ions 103 are obtained as follows: a source gas is excited to generate plasma of the source gas, and ions included in the plasma are extracted from the plasma by the action of an electric field and are then accelerated.

The depth of the region where the embrittlement region 104 is formed can be controlled depending on the kinetic energy, the mass, the electrical charge, and the incident angle of the ions 103. The kinetic energy can be controlled by an acceleration voltage, dosage, and the like. The embrittlement region 104 is formed at the same depth or substantially the same depth as the average depth at which the ions 103 have entered. Therefore, the thickness of a single crystal semiconductor layer separated from the single crystal semiconductor substrate 100 is determined by the depth to which the ions 103 are added. The depth at which the embrittlement region 104 is formed is adjusted so that the thickness of the single crystal semiconductor layer can be 110 nm to 500 nm inclusive, preferably 50 nm to 200 nm inclusive.

The embrittlement region 104 can be formed by ion doping-treatment. The ion-doping treatment can be performed using an ion-doping apparatus. An ion-doping apparatus is typically a non-mass-separation type apparatus for irradiating an object to be processed which is disposed in a chamber with all kinds of ions which are generated by plasma excitation of a process gas. The apparatus is called "non-mass-separation type apparatus" because an object to be processed is irradiated with all kinds of ions without mass-separating ions in plasma. In contrast, an ion-implantation apparatus is a mass-separation apparatus. The ion-implantation apparatus is an apparatus with which an object is irradiated with ion species having a specific mass through mass separation of ion species in plasma.

Main components of the ion-doping apparatus are as follows: a chamber in which an object is disposed; an ion source for generating desired ions; and an acceleration mechanism for acceleration of ions and for irradiation therewith. The ion source includes a gas supply device for supplying a source gas to generate a desired ion species, an electrode for exciting the source gas to generate plasma, and the like. As the electrode for generating plasma, a filament electrode, a capacitive coupling high-frequency discharging electrode, or the like is used. The acceleration mechanism includes electrodes such as an extraction electrode, an acceleration electrode, a deceleration electrode, and a ground electrode; a power supply for supplying power to these electrodes; and the like. These electrodes that are included in the acceleration mechanism are provided with a plurality of openings or slits, through which ions that are generated from the ion source are accelerated. Note that the components of the ion-doping apparatus are not limited to the aforementioned components, and a mechanism as needed is provided.

In this embodiment, hydrogen is added to the single crystal semiconductor substrate 100 using an ion-doping apparatus. A hydrogen-containing gas is supplied as a plasma source gas. For example, $H_2$ is supplied. Plasma is generated by excitation of a hydrogen gas. Then, ions included in plasma are accelerated without mass separation and the single crystal semiconductor substrate 100 is irradiated with the accelerated ions.

In the ion-doping apparatus, the percentage of $H_3^+$ to the total quantity of ion species ($H^+$, $H_2^+$, and $H_3^+$) generated from a hydrogen gas is set to 50% or higher. Preferably, the percentage of $H_3^+$ is set to 80% or higher. Since mass separation is not performed in the ion-doping apparatus, the percentage of one kind ($H_3^+$) to plural kinds of ion species generated in plasma is preferably set to 50% or higher, more preferably 80% or higher. By irradiation with ions having the same mass, ions can be added in a concentrated manner to the same depth in the single crystal semiconductor substrate 100.

In order to form the embrittlement region 104 in a shallow region, the acceleration voltage for the ions 103 is required to be low. By increase in the percentage of $H_3^+$ ions in plasma, atomic hydrogen (H) can be added to the single crystal semiconductor substrates 100 efficiently. Because the mass of an $H_3^+$ ion is three times as large as that of an $H^+$ ion, when hydrogen atoms are added to the same depth, the acceleration voltage for an $H_3^+$ ion can be three times as high as that of an $H^+$ ion. When the acceleration voltage of ions can be increased, the cycle time of an ion irradiation step can be shortened, and productivity and throughput can be improved.

Ion-doping apparatuses are inexpensive and excellent for use in large-area treatment. Therefore, by irradiation with $H_3^+$ with use of such an ion-doping apparatus, significant effects such as improvement in semiconductor characteristics, increase in area, reduction in costs, and improvement in productivity can be obtained. In addition, when the ion-doping apparatus is used, there is a possibility that a heavy metal is introduced at the same time; however, by performing irradiation with ions through the oxide film 132 including a chlorine atom, the single crystal semiconductor substrate 100 can be prevented from being contaminated by such a heavy metal as described above.

Note that the step of irradiating the single crystal semiconductor substrate 100 with the ions 103 that are accelerated can also be performed using an ion-implantation apparatus. The ion-implantation apparatus is a mass-separation apparatus with which an object that is disposed in a chamber is irradiated with a specific ion species through mass separation of a plurality of ion species that are generated by plasma excitation of a source gas. Thus, when an ion-implantation apparatus is used, $H^+$ ions and $H_2^+$ ions that are generated by excitation of a hydrogen gas or $PH_3$ are subjected to mass separation, and either $H^+$ ions or $H_2^+$ ions are accelerated, with which the single crystal semiconductor substrates 100 is irradiated.

Next, the base substrate 120 is prepared (see FIG. 2B1).

As the base substrate 120, a substrate formed from an insulator is used. In specific, a variety of glass substrates that are used in the electronics industry, such as aluminosilicate glass substrates, aluminoborosilicate glass substrates, and barium borosilicate glass substrates; quartz substrates; ceramic substrates; and sapphire substrates can be used. In this embodiment, a case of using a glass substrate is described. With use of a glass substrate which can have a large area and is inexpensive as the base substrate 120, a cost can be reduced.

Further, a surface of the base substrate 120 is preferably cleaned before the base substrate 120 is used. Specifically, ultrasonic cleaning is performed on the base substrate 120 using a hydrochloric acid/hydrogen peroxide mixture (HPM), a sulfuric acid/hydrogen peroxide mixture (SPM), an ammonium hydroxide/hydrogen peroxide mixture (APM), diluted hydrogen fluoride (DHF), or the like. For example, ultrasonic cleaning is preferably performed on the surface of the base substrate 120 using a hydrochloric acid/hydrogen peroxide mixture. Through such cleaning treatment, the surface of the base substrate 120 can be planarized and abrasive particles left on the surface of the base substrate 120 can be removed.

Next, a nitrogen-containing layer 121 (for example, an insulating film including nitrogen such as a silicon nitride film ($SiN_x$) or a silicon nitride oxide film ($SiN_xO_y$) (x>y)) is formed over the surface of the base substrate 120 (see FIG. 2B2).

In this embodiment, the nitrogen-containing layer 121 functions as a layer (a bonding layer) which is to be bonded with the oxide film 132 formed over the single crystal semiconductor substrate 100. In addition, when the single crystal semiconductor layer including a single crystal structure is formed over the base substrate later, the nitrogen-containing layer 121 functions as a barrier layer for preventing impurities such as Na (sodium) included in the base substrate from diffusing into the single crystal semiconductor layer.

In addition, since the nitrogen-containing layer 121 is used as the bonding layer, it is preferable that a surface of the nitrogen-containing layer 121 is smooth in order to suppress defective bonding. Specifically, the nitrogen-containing layer 121 is formed to have a surface with an average surface roughness (Ra) of less than 0.5 nm and a root-mean-square surface roughness (Rms) of 0.60 nm or less, more preferably, an average surface roughness of 0.35 nm or less and a root-mean-square surface roughness of 0.45 nm or less. The thickness of the nitrogen-containing layer 121 is preferably in the range of 10 nm to 200 nm inclusive, more preferably, 50 nm to 100 nm inclusive.

Next, the surface of the single crystal semiconductor substrate 100 and the surface of the base substrate 120 are disposed so as to face each other and then the surface of the oxide film 132 and the surface of the nitrogen-containing layer 121 are bonded together (see FIG. 2C).

Here, after the single crystal semiconductor substrate 100 and the base substrate 120 are bonded together with the oxide film 132 and the nitrogen-containing layer 121 interposed therebetween, a pressure of approximately 0.1 N/cm² to 500 N/cm², preferably 1 N/cm² to 20 N/cm² is applied to part of the single crystal semiconductor substrate 100. Bonding of the oxide film 132 and the nitrogen-containing layer 121 begins at the part to which the pressure is applied and then extends spontaneously throughout the surface. This bonding step is performed by Van der Waals force or hydrogen bond at the normal temperature without heat treatment. Therefore, a substrate with low heat resistance temperature such as a glass substrate can be used as the base substrate 120.

Note that before the bonding of the single crystal semiconductor substrate 100 and the base substrate 120, surface treatment is preferably performed on the oxide film 132 formed over the single crystal semiconductor substrate 100 and the nitrogen-containing layer 121 formed over the base substrate 120.

As the surface treatment, plasma treatment, ozone treatment, megasonic cleaning, two fluid cleaning (a method of spraying with functional water such as pure water or water to which hydrogen is added together with a carrier gas such as nitrogen), or a combination thereof can be employed. In particular, after plasma treatment is performed on at least one of the surfaces of the oxide film 132 and the nitrogen-containing layer 121, dust such as an organic material on the surfaces of the oxide film 132 and the nitrogen-containing layer 121 can be removed and the surfaces can have a hydrophilic property by performing ozone treatment, megasonic cleaning, two fluid cleaning or the like. As a result, a bonding strength between the oxide film 132 and the nitrogen-containing layer 121 can be increased.

Here, an example of the ozone treatment is described. For example, by irradiation with ultraviolet rays (UV) under an atmosphere including oxygen, ozone treatment can be performed on a surface of a processing object. Ozone treatment in which irradiation with ultraviolet rays is performed under an atmosphere including oxygen is also referred to as UV ozone treatment or ultraviolet ozone treatment. By irradiation with light of ultraviolet rays having a wavelength of less than 200 nm and light of ultraviolet rays having a wavelength of greater than 200 nm under an atmosphere including oxygen, ozone is generated and singlet oxygen can be generated from the ozone. By irradiation with light of ultraviolet rays having a wavelength of less than 180 nm, ozone can be generated and singlet oxygen can also be generated from the ozone.

The followings are examples of reactions resulted from the irradiation with light having a wavelength of less than 200 nm and light having a wavelength of greater than or equal to 200 nm under an atmosphere including oxygen.

$$O_2 + h\nu(\lambda_1 \text{ nm}) \rightarrow O(^3P) + O(^3P) \qquad (1)$$

$$O(^3P) + O_2 \rightarrow O_3 \qquad (2)$$

$$O_3 + h\nu(\lambda_2 \text{ nm}) \rightarrow O(^1D) + O_2 \qquad (3)$$

In the above reaction formula (1), by irradiation with light (hν) having a wavelength of less than 200 nm ($\lambda_1$ nm) under an atmosphere including oxygen ($O_2$), an oxygen atom in a ground state ($O(^3P)$) is generated. Next, in the above reaction formula (2), when an oxygen atom in a ground state ($O(^3P)$)

and oxygen ($O_2$) react to each other, ozone ($O_3$) is generated. Then, in the reaction formula (3), by irradiation with light having a wavelength of greater than or equal to 200 nm ($\lambda_2$ nm) under an atmosphere including ozone ($O_3$), singlet oxygen in an excited state $O(^1D)$ is generated. Ozone is generated by the irradiation with light of ultraviolet rays having a wavelength of less than 200 nm under the atmosphere including oxygen and then decomposition of ozone is caused by the irradiation with light having a wavelength of greater than or equal to 200 nm, whereby singlet oxygen is generated. The ozone treatment described above can be performed by irradiation with a low-pressure mercury lamp ($\lambda_1$=185 nm and $\lambda_2$=254 nm) under an atmosphere including oxygen, for example.

Further, the following is an example of reactions resulted from the irradiation with light having a wavelength of less than 180 nm under an atmosphere including oxygen.

$$O_2 + h\nu(\lambda_3 \text{ nm}) \rightarrow O(^1D) + O(^3P) \quad (4)$$

$$O(^3P) + O_2 \rightarrow_3 \quad (5)$$

$$O_3 + h\nu(\lambda_3 \text{ nm}) \rightarrow O(^1D) + O_2 \quad (6)$$

In the above reaction formula (4), by irradiation with light having a wavelength of less than 180 nm ($\lambda_3$ nm) under an atmosphere including oxygen ($O_2$), singlet oxygen in an excited state ($O(^1D)$) and an oxygen atom in a ground state ($O(^3P)$) are generated. Next, in the above reaction formula (5), when an oxygen atom in a ground state ($O(^3P)$) and oxygen ($O_2$) react to each other, ozone ($O_3$) is generated. In the above reaction formula (6), by irradiation with light having a wavelength of less than 180 nm ($\lambda_3$ nm) under an atmosphere including generated ozone ($O_3$), singlet oxygen in an excited state and oxygen are generated. By performing the irradiation with light of ultraviolet rays having a wavelength of less than 180 nm under the atmosphere including oxygen, ozone is generated and ozone or oxygen are decomposed to generate singlet oxygen. The ozone treatment described above can be performed by irradiation with an Xe excimer UV lamp ($\lambda_3$=172 nm) under an atmosphere including oxygen, for example.

A chemical bond of an organic material or the like attached to a surface of a processing object can be broken by the light having a wavelength of less than 200 nm and the organic material, the organic material whose chemical bond is broken, and the like which are attached to the surface of the processing object can be oxidatively decomposed and removed by ozone or singlet oxygen generated from ozone. By performing the ozone treatment described above, hydrophilicity and cleanliness of the surface of the processing object can be increased and favorable bonding can be performed.

By irradiation with ultraviolet rays under an atmosphere including oxygen, ozone is generated. Ozone has an effect of removing an organic material attached to the surface of the processing object. Further, singlet oxygen also has an effect of removing an organic material attached to the surface of the processing object, which is as effective as or more effective than ozone. Ozone and singlet oxygen are examples of oxygen in an activated state and collectively referred to as active oxygen. As described in the above reaction formulae and the like, there is reaction of generation of ozone in generation of singlet oxygen or reaction of generation of singlet oxygen from ozone. Therefore, here, reactions including the reaction to which singlet oxygen contributes are referred to as ozone treatment for convenience.

In FIG. 2C, after the oxide film 132 and the nitrogen-containing layer 121 are bonded together, heat treatment for increasing the bonding strength is preferably performed. This heat treatment is performed at a temperature at which a crack is not generated in the embrittlement region 104 and, for example, can be performed at a temperature higher than or equal to a room temperature and less than 400° C. Alternatively, the bonding to the oxide film 132 and the nitrogen-containing layer 121 may be performed while performing heating at the temperature in the aforementioned range. For this heat treatment, a heating furnace such as a diffusion furnace and a resistance heating furnace, an RTA apparatus (rapid thermal annealing), a microwave heating apparatus, or the like can be used.

In general, when heat treatment is performed at the same time as or after the oxide film 132 and the nitrogen-containing layer 121 are bonded together, dehydration reaction proceeds at bonding interfaces. Then the bonding interfaces come closer to each other and therefore, hydrogen bonding is strengthened and covalent bond is formed, whereby the bonding is strengthened. In order to promote dehydration reaction, moisture generated at the bonding interfaces by dehydration reaction needs to be removed by heat treatment at a high temperature. In other words, in the case where a heat treatment after the bonding is performed at a low temperature, the moisture generated at the bonding interfaces by dehydration reaction cannot be removed effectively. Accordingly dehydration reaction does not proceed and therefore, it is difficult to increase the bonding strength sufficiently.

On the other hand, in the case where an oxide film including a chlorine atom or the like is used as the oxide film 132, moisture can be absorbed and diffused into the oxide film 132; therefore, even if the heat treatment after the bonding is performed at a low temperature, the moisture generated at a bonding interfaces due to dehydration reaction can be absorbed and diffused into the oxide film 132 and dehydration reaction can be promoted efficiently. In this case, even when a low-heat-resistance substrate such as a glass substrate is used as the base substrate 120, the bonding strength between the oxide film 132 and the nitrogen-containing layer 121 can be increased sufficiently. Alternatively, in the case where plasma treatment is performed by applying bias voltage, micropores are formed in the vicinity of the surface of the oxide film 132, whereby moisture can be absorbed and diffused efficiently. Accordingly, the bonding strength between the oxide film 132 and the nitrogen-containing layer 121 can be increased even if the heat treatment is performed at a low temperature.

Next, heat treatment is performed and separation is generated at the embrittlement region 104, so that a single crystal semiconductor layer 124 is formed over the base substrate 120 with the oxide film 132 and the nitrogen-containing layer 121 interposed therebetween (see FIG. 2D).

When the heat treatment is performed, an element which has been added in microvoids formed in the embrittlement region 104 is deposited and the volume is changed due to increase of a temperature, whereby a crack is generated in the embrittlement region 104. Accordingly, the single crystal semiconductor substrate 100 is cleaved along the embrittlement region 104. Since the oxide film 132 is bonded to the base substrate 120, the single crystal semiconductor layer 124, which has been separated from the single crystal semiconductor substrate 100, is formed over the base substrate 120. Further, the temperature in the heat treatment is set so as not to exceed the strain point of the base substrate 120.

For this heating treatment, a heating furnace such as a diffusion furnace and a resistance heating furnace, an RTA apparatus, a microwave heating apparatus, or the like can be used. For example, in the case of using an RTA apparatus, the heat treatment can be performed at a heat temperature of 550° C. to 730° C. inclusive, for a process time of 0.5 minutes to 60 minutes inclusive.

Note that the aforementioned heat treatment for increase of the bonding strength between the oxide film 132 and the base substrate 120 is not performed and heat treatment for increase of the bonding strength between the oxide film 132 and nitrogen-containing layer 121 and the heat treatment for separation in the embrittlement region 104 are performed at the same time by performing the heat treatment of FIG. 1D.

Through the above process, an SOI substrate can be manufactured in which the single crystal semiconductor layer 124 is provided over the base substrate 120 with the oxide film 132 and the nitrogen-containing layer 121 interposed therebetween. In the case where the nitrogen-containing layer 121 is used as the bonding layer, the bonding strength between the base substrate 120 and the single crystal semiconductor layer 124 can be improved and reliability can be improved by employing the manufacturing method described in this embodiment. As a result, an SOI substrate in which an impurity is prevented from being diffused into the single crystal semiconductor layer 124 formed over the base substrate and the base substrate 120 and the single crystal semiconductor layer 124 are bonded together strongly can be formed.

In addition, the nitrogen-containing layer is provided over the base substrate and the oxide film including halogen such as chlorine is formed over the semiconductor substrate, whereby an impurity element can be prevented from entering the semiconductor substrate before the bonding of the semiconductor substrate and the base substrate in addition to simplification of the manufacturing process. In the case where the heat treatment after the bonding is performed at a low temperature, the oxide film including halogen such as chlorine is formed as the bonding layer formed over the semiconductor substrate and then dehydration reaction is promoted efficiently, whereby the bonding strength can be improved.

After that, as described in Embodiment 1, the single crystal semiconductor layer 124 is irradiated with a laser beam, whereby the crystallinity of the single crystal semiconductor layer 124 is repaired. The laser irradiation step can be performed by utilizing the method and the apparatus described in the aforementioned embodiments.

Note that in this embodiment, the oxide film 132 is formed over the single crystal semiconductor substrate 100 and the nitrogen-containing layer 121 is formed over the base substrate 120; however, the present invention is not limited thereto. For example, the oxide film 132 and a nitrogen-containing layer may be stacked in this order over the single crystal semiconductor substrate 100 and then a surface of the nitrogen-containing layer formed over the oxide film 132 and the surface of the base substrate 120 may be bonded together. In this case, the nitrogen-containing layer is provided either before formation of the embrittlement region 104 or after formation thereof. Note that an oxide film (for example, silicon oxide) may be formed over the nitrogen containing layer and a surface of the oxide film and the surface of the base substrate 120 may be bonded together.

In the case where mixing of an impurity from the base substrate 120 to the single crystal semiconductor layer 124 does not become a problem, the nitrogen-containing layer 121 is not provided over the base substrate 120 and the surface of the oxide film 132 provided over the single crystal semiconductor substrate 100 and the surface of the base substrate 120 may be bonded together.

Note that the structure described in this embodiment can be implemented by being combined as appropriate with any one of structures described in other embodiments in this specification.

EMBODIMENT 5

In this embodiment, a method for manufacturing a semiconductor device using the SOI substrate manufactured according to the above embodiments is described.

First, a method for manufacturing an n-channel thin film transistor and a p-channel thin film transistor is described with reference to FIGS. 4A to 4D and FIGS. 5A to 5C. Various kinds of semiconductor devices can be formed by combining a plurality of thin film transistors (TFTs).

In this embodiment, the case where an SOI substrate manufactured according to the process of FIGS. 2A1 to 2D is used as the SOI substrate is described. Needless to say, an SOI substrate manufactured according to other method described in the aforementioned embodiment can be used.

Figure 4A:
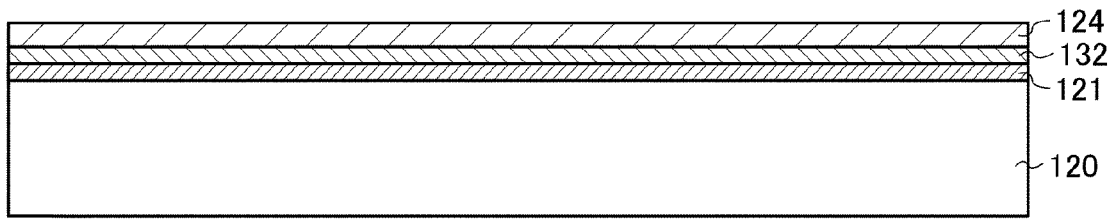
FIGS. 4A to 4D illustrate an example of a method for manufacturing a semiconductor device using an SOI substrate.

FIG. 4A illustrates a cross-sectional view of the SOI substrate manufactured according to the method which is described with reference to FIGS. 2A1 to 2D.

Figure 4B:
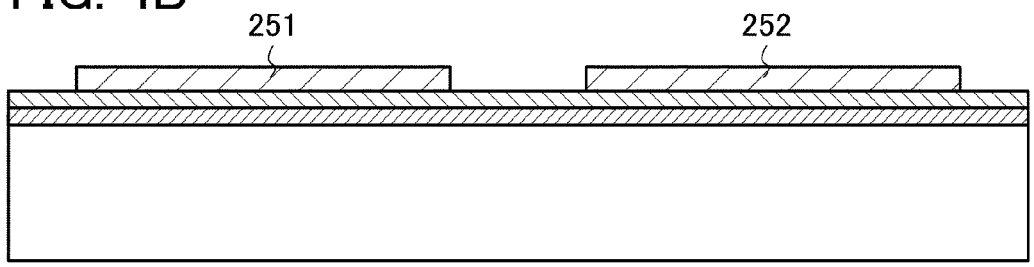

First, a single crystal semiconductor layer 124 is separated into each element by etching to form semiconductor layers 251 and 252 as illustrated in FIG. 4B. The semiconductor layer 251 is included in an n-channel TFT, and the semiconductor layer 252 is included in a p-channel TFT.

Figure 4C:
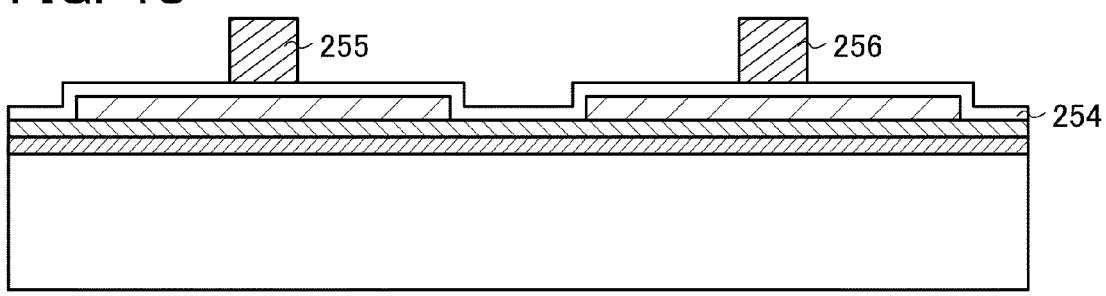

As illustrated in FIG. 4C, an insulating film 254 is formed over the semiconductor layers 251 and 252. Then, a gate electrode 255 is formed over the semiconductor layer 251 with the insulating film 254 interposed therebetween, and a gate electrode 256 is formed over the semiconductor layer 252 with the insulating film 254 interposed therebetween.

Note that before etching of the single crystal semiconductor layer 124, it is preferable to add an impurity element such as boron, aluminum, or gallium, or an impurity element such as phosphorus or arsenic, to the single crystal semiconductor layer 124 in order to control the threshold voltage of the TFTs. For example, an impurity element is added to a region where an n-channel TFT is to be formed, and an impurity element is added to a region where a p-channel TFT is to be formed.

Figure 4D:
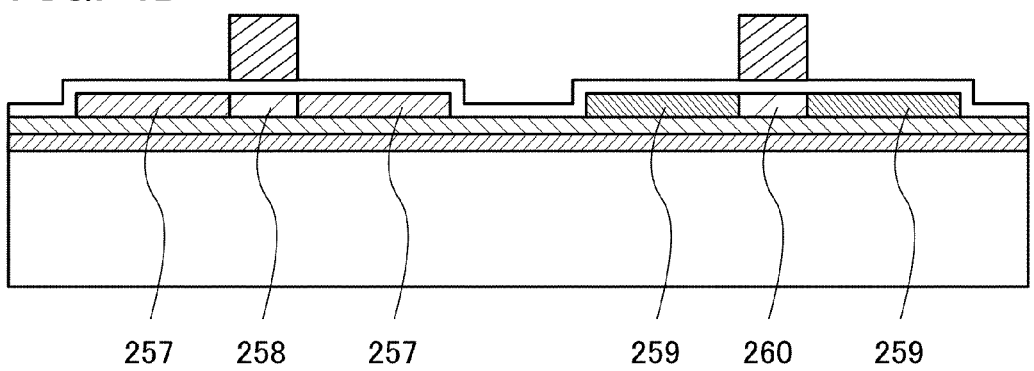

Next, as illustrated in FIG. 4D, n-type low-concentration impurity regions 257 are formed in the semiconductor layer 251, and p-type high-concentration impurity regions 259 are formed in the semiconductor layer 252. In particular, first of all, the n-type low-concentration impurity regions 257 are formed in the semiconductor layer 251. In order to form the n-type low-concentration impurity regions 257, the semiconductor layer 252 for the p-channel TFT is covered with a resist mask, and an impurity element is added to the semiconductor layer 251. As the impurity element, phosphorus or arsenic may be added. When the impurity element is added by an ion-doping method or an ion-implantation method, the gate electrode 255 functions as a mask, and the n-type low-concentration impurity regions 257 are formed in the semiconductor layer 251 in a self-aligned manner. A region of the semiconductor layer 251 which overlaps with the gate electrode 255 functions as a channel formation region 258.

Next, the mask covering the semiconductor layer 252 is removed and then the semiconductor layer 251 where the n-channel TFT is formed is covered with a resist mask. Next, an impurity element is added to the semiconductor layer 252 by an ion-doping method or an ion-implantation method. As the impurity element, boron can be added. In the step of adding the impurity element, the gate electrode 256 functions as a mask and the p-type high-concentration impurity regions 259 are formed in the semiconductor layer 252 in a self-aligned manner. The high-concentration impurity regions 259 function as a source region and a drain region. A region of the semiconductor layer 252 which overlaps with the gate electrode 256 functions as a channel formation region 260. Here, the method in which the p-type high-concentration impurity regions 259 are formed after the n-type low-concentration impurity regions 257 are formed is described; however, the p-type high-concentration impurity regions 259 can be formed first.

Figure 5A:
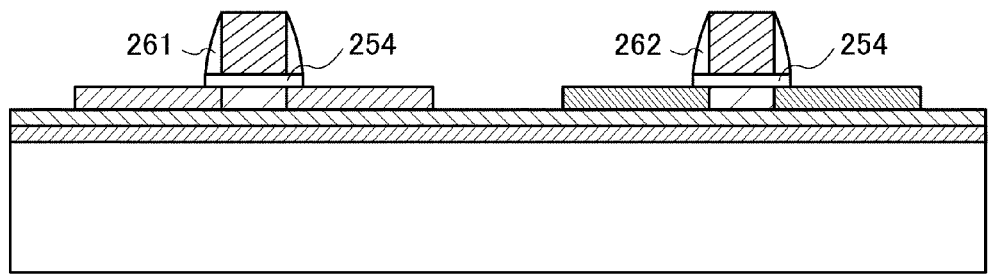
FIGS. 5A to 5C illustrate the example of the method for manufacturing the semiconductor device using the SOI substrate.

Next, after the resist which covers the semiconductor layer 251 is removed, an insulating film having a single layer structure of a nitrogen compound such as silicon nitride or an oxide such as silicon oxide or a stacked layer structure thereof is formed by a plasma CVD method or the like. This insulating film is anisotropically etched in a perpendicular direction to form sidewall insulating films 261 and 262 which are in contact with side surfaces of the gate electrodes 255 and 256, respectively as illustrated in FIG. 5A. By this anisotropic etching, the insulating film 254 is also etched.

Figure 5B:
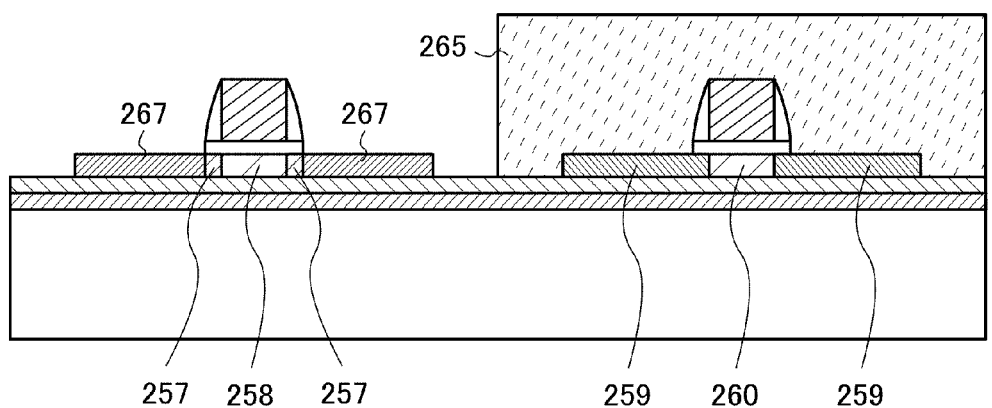

Next, as illustrated in FIG. 5B, the semiconductor layer 252 is covered with a resist 265. In order to form high-concentration impurity regions functioning as a source region and a drain region in the semiconductor layer 251, an impurity element is added into the semiconductor layer 251 at a high dose by an ion-implantation method or an ion-doping method. The gate electrode 255 and the sidewall insulating film 261 function as masks, and n-type high-concentration impurity regions 267 are formed. Next, heat treatment is performed in order to activate the impurity element.

Figure 5C:
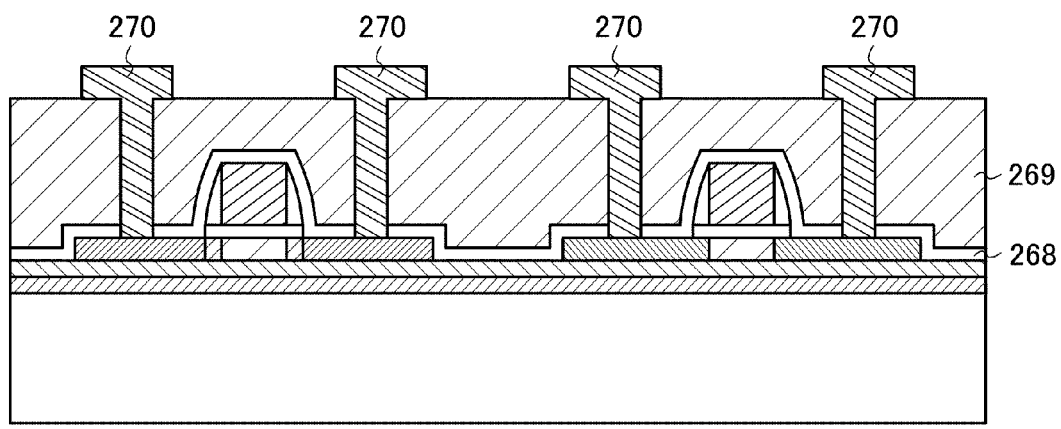

After the heat treatment for activation, an insulating film 268 including hydrogen is formed as illustrated in FIG. 5C. After the insulating film 268 is formed, heat treatment is performed at a temperature of from 350° C. to 450° C. inclusive, and hydrogen included in the insulating film 268 is diffused into the semiconductor layers 251 and 252. The insulating film 268 can be formed by deposition of silicon nitride or silicon nitride oxide by a plasma CVD method at a process temperature of 350° C. or less. The supply of hydrogen to the semiconductor layers 251 and 252 makes it possible to efficiently compensate defects which are to be trapping centers in the semiconductor layers 251 and 252 and at an interface with the insulating film 254.

After that, an interlayer insulating film 269 is formed. The interlayer insulating film 269 can be formed of a film having a single layer structure or a stacked layer structure of any one or more of films selected from an insulating film containing an inorganic material, such as a silicon oxide film or a BPSG (borophosphosilicate glass) film, and an organic resin film containing polyimide, acrylic, or the like. After contact holes are formed in the interlayer insulating film 269, wirings 270 are formed as illustrated in FIG. 5C. The wirings 270 can be formed using a conductive film having a three-layer structure in which a low-resistance metal film such as an aluminum film or an aluminum-alloy film is sandwiched between barrier metal films. The barrier metal films can be formed using metal films which include molybdenum, chromium, titanium, and/or the like.

Through the above steps, a semiconductor device having the n-channel TFT and the p-channel TFT can be manufactured. Since the oxygen concentration of the semiconductor layer in which the channel formation region is formed is reduced in the manufacturing process of the SOI substrate, a TFT in which off current is small and variation of the threshold voltage is suppressed can be manufactured. It is preferable that the oxygen concentration of the semiconductor layer in which the channel formation region is formed is set to less than $1\times10^{18}$ atoms/cm$^3$, more preferably less than $5\times10^{17}$ atoms/cm$^3$.

Although the method for manufacturing the TFTs is described with reference to FIGS. 4A to 4D and FIGS. 5A to 5C, a semiconductor device with a higher added value can be manufactured by formation of various semiconductor elements such as a capacitor and a resistor together with the TFTs. Hereinafter, specific modes of a semiconductor device are described using drawings.

Figure 6:
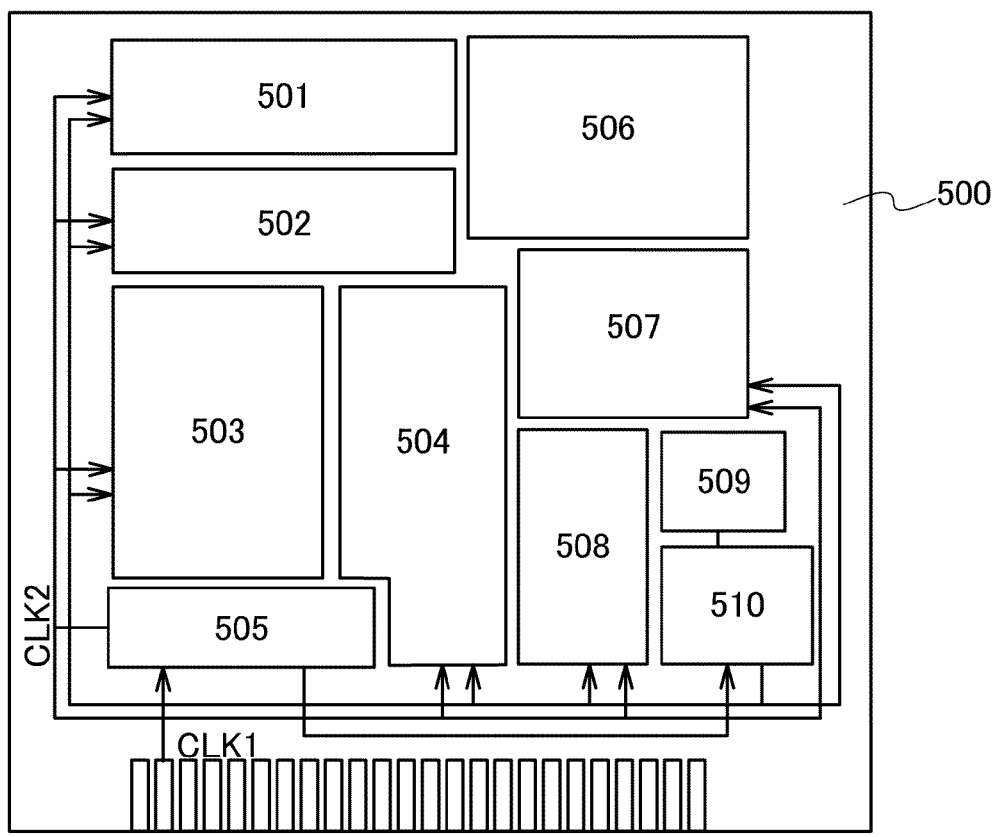
FIG. 6 is a diagram showing an example of a semiconductor device in which an SOI substrate is used.

First, a microprocessor is described as an example of a semiconductor device. FIG. 6 is a block diagram showing a structural example of a microprocessor 500.

The microprocessor 500 includes an arithmetic logic unit (also referred to as an "ALU") 501, an arithmetic logic unit controller (ALU controller) 502, an instruction decoder 503, an interrupt controller 504, a timing controller 505, a register 506, a register controller 507, a bus interface (Bus I/F) 508, a read only memory 509, and a memory interface 510.

An instruction input to the microprocessor 500 via the bus interface 508 is input to the instruction decoder 503 and decoded. Then, the instruction is input to the ALU controller 502, the interrupt controller 504, the register controller 507, and the timing controller 505. The ALU controller 502, the interrupt controller 504, the register controller 507, and the timing controller 505 perform various controls based on the decoded instruction.

The ALU controller 502 generates a signal for controlling the operation of the arithmetic logic unit 501. While the microprocessor 500 is executing a program, the interrupt controller 504 processes an interrupt request from an external input and output device or a peripheral circuit. The interrupt controller 504 judges the priority of the interrupt request or a mask state, and processes the interrupt request. The register controller 507 generates an address of the register 506, and reads/writes data from/to the register 506 in accordance with the state of the microprocessor 500. The timing controller 505 generates signals for controlling timing of driving of the arithmetic logic unit 501, the ALU controller 502, the instruction decoder 503, the interrupt controller 504, and the register controller 507. For example, the timing controller 505 is provided with an internal clock generator for generating an internal clock signal CLK2 based on a reference clock signal CLK1. As shown in FIG. 6, the internal clock signal CLK2 is input to another circuits.

Next, an example of a semiconductor device having a function of communicating data wirelessly and also having an arithmetic function will be described.

Figure 7:
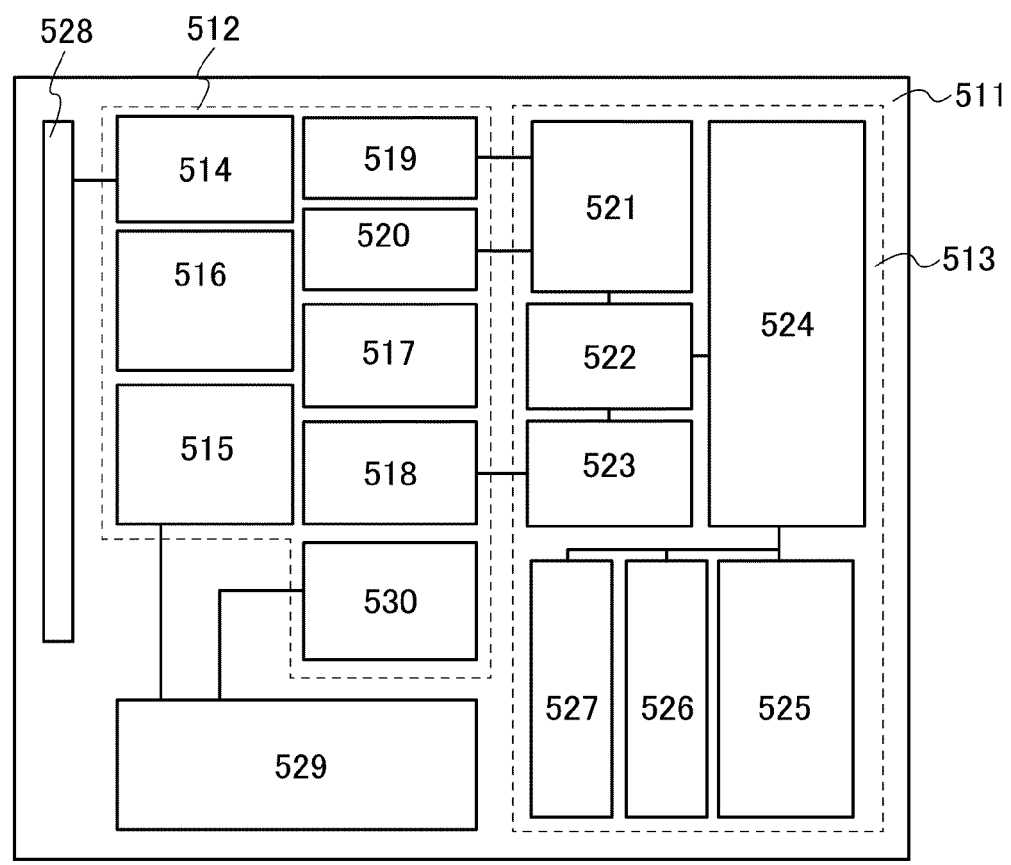
FIG. 7 is a diagram showing an example of a semiconductor device in which an SOI substrate is used.

FIG. 7 is a block diagram showing a structural example of such a semiconductor device. The semiconductor device shown in FIG. 7 can be regarded as a computer (hereinafter also referred to as an "RFCPU") which operates to transmit and receive signals to and from an external device via wireless communication.

As shown in FIG. 7, an RFCPU 511 includes an analog circuit portion 512 and a digital circuit portion 513. The analog circuit portion 512 includes a resonance circuit 514 having a resonant capacitor, a rectifier circuit 515, a constant voltage circuit 516, a reset circuit 517, an oscillator circuit 518, a demodulation circuit 519, a modulation circuit 520, and a power supply control circuit 530. The digital circuit portion 513 includes an RF interface 521, a control register 522, a clock controller 523, a interface 524, a central processing unit 525, a random access memory 526, and a read only memory 527.

The operation of the RFCPU 511 is roughly described below. The resonance circuit 514 generates induced electromotive force based on a signal received at an antenna 528. The induced electromotive force is stored in a capacitor portion 529 via the rectifier circuit 515. The capacitor portion 529 is preferably formed using a capacitor such as a ceramic capacitor or an electric double layer capacitor. The capacitor portion 529 is not necessarily integrated over the same substrate as the RFCPU 511 and may be incorporated into the RFCPU 511 as a component.

The reset circuit 517 generates a signal for resetting and initializing the digital circuit portion 513. For example, the reset circuit 517 generates a signal which rises after rise in the supply voltage with delay as a reset signal. The oscillator circuit 518 changes the frequency and the duty ratio of a clock signal in accordance with a control signal generated by the constant voltage circuit 516. The demodulation circuit 519 demodulates a received signal, and the modulation circuit 520 modulates data to be transmitted.

For example, the demodulation circuit 519 is formed using a low-pass filter and binarizes a received signal of an amplitude shift keying (ASK) system based on variation of the amplitude. The modulation circuit 520 transmits transmission data by changing the amplitude of a transmission signal of the amplitude shift keying (ASK) system. The modulation circuit 520 changes the resonance point of the resonance circuit 514, whereby the amplitude of a communication signal is changed.

The clock controller 523 generates a control signal for changing the frequency and the duty ratio of the clock signal in accordance with the power supply voltage or current consumption in the central processing unit 525. The power supply voltage is monitored by the power supply control circuit 530.

A signal that is input to the RFCPU 511 from the antenna 528 is demodulated by the demodulation circuit 519, and then divided into a control command, data, and the like by the RF interface 521. The control command is stored in the control register 522. The control command includes reading of data stored in the read only memory 527, writing of data to the random access memory 526, an arithmetic instruction to the central processing unit 525, and the like.

The central processing unit 525 accesses the read only memory 527, the random access memory 526, and the control register 522 via the interface 524. The interface 524 has a function of generating an access signal for any one of the read only memory 527, the random access memory 526, and the control register 522 based on an address requested by the central processing unit 525.

As an arithmetic method of the central processing unit 525, a method may be employed in which the read only memory 527 stores an OS (operating system) and a program is read at the time of starting operation and then executed. Alternatively, a method in which a circuit dedicated to arithmetic is formed and an arithmetic processing is conducted using hardware may be employed. In a method in which both hardware and software are used, part of arithmetic processing can be conducted by a circuit dedicated to arithmetic, and the other part of the arithmetic processing can be conducted by the central processing unit 525 using a program.

Next, display devices are described using FIGS. 8A and 8B and FIGS. 9A and 9B.

Figure 8A:
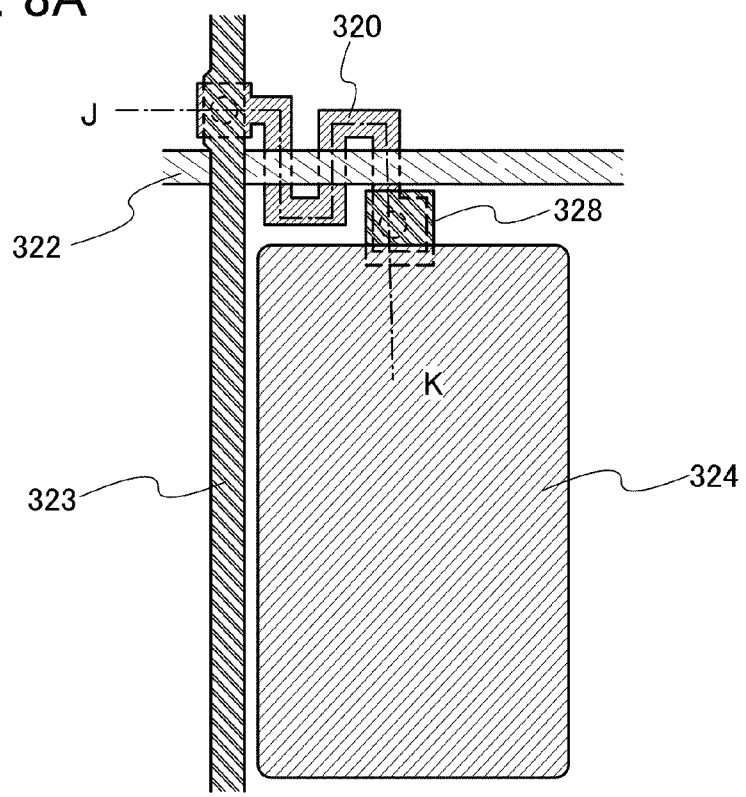
FIGS. 8A and 8B illustrate an example of a display device in which an SOI substrate is used.
Figure 8B:
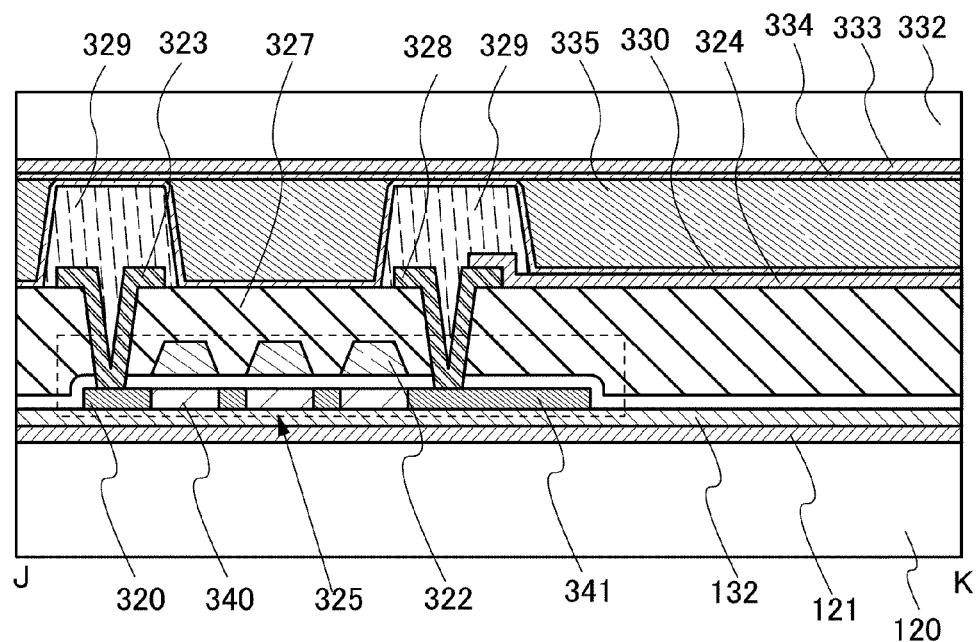

FIGS. 8A and 8B are drawings for describing a liquid crystal display device. FIG. 8A is a plan view of a pixel of a liquid crystal display device, and FIG. 8B is a cross-sectional view taken along a line J-K in FIG. 8A.

As illustrated in FIG. 8A, the pixel includes a single crystal semiconductor layer 320, a scanning line 322 intersecting with the single crystal semiconductor layer 320, a signal line 323 intersecting with the scanning line 322, a pixel electrode 324, and an electrode 328 which electrically connects the pixel electrode 324 with the single crystal semiconductor layer 320. The single crystal semiconductor layer 320 is formed using a single crystal semiconductor layer formed over the base substrate 120 and included in a TFT 325 of a pixel.

As an SOI substrate, the SOI substrate described in the above embodiment is used. As illustrated in FIG. 8B, the single crystal semiconductor layer 320 is stacked over the base substrate 120 with an oxide film 132 and a nitrogen-containing layer 121 interposed therebetween. As the base substrate 120, for example, a glass substrate can be used. The single crystal semiconductor layer of the SOI substrate is separated into each element by etching, whereby the single crystal semiconductor layer 320 of the TFT 325 is formed. A channel formation region 340 and n-type high-concentration impurity regions 341 to which an impurity element is added are formed in the single crystal semiconductor layer 320. A gate electrode of the TFT 325 is included in the scanning line 322 and one of a source electrode and a drain electrode of the TFT 325 is included in the signal line 323.

The signal line 323, the pixel electrode 324, and the electrode 328 are provided over the interlayer insulating film 327. Over the interlayer insulating film 327, columnar spacers 329 are formed. An orientation film 330 is formed to cover the signal line 323, the pixel electrode 324, the electrode 328, and the columnar spacers 329. A counter substrate 332 is provided with a counter electrode 333 and an orientation film 334 which covers the counter electrode 333. The column spacers 329 are formed to keep the space between the base substrate 120 and the counter substrate 332. A liquid crystal layer 335 is formed in the space formed by the column spacers 329. The interlayer insulating film 327 has a step at the connection portion between the n-type high-concentration impurity regions 341, and the signal line 323 and the electrode 328 due to formation of contact holes; therefore, orientation of liquid crystals in the liquid crystal layer 335 is easily disordered at this connection portion. Therefore, the columnar spacers 329 are formed at these step portions to prevent disorder of liquid crystal orientation.

Figure 9A:
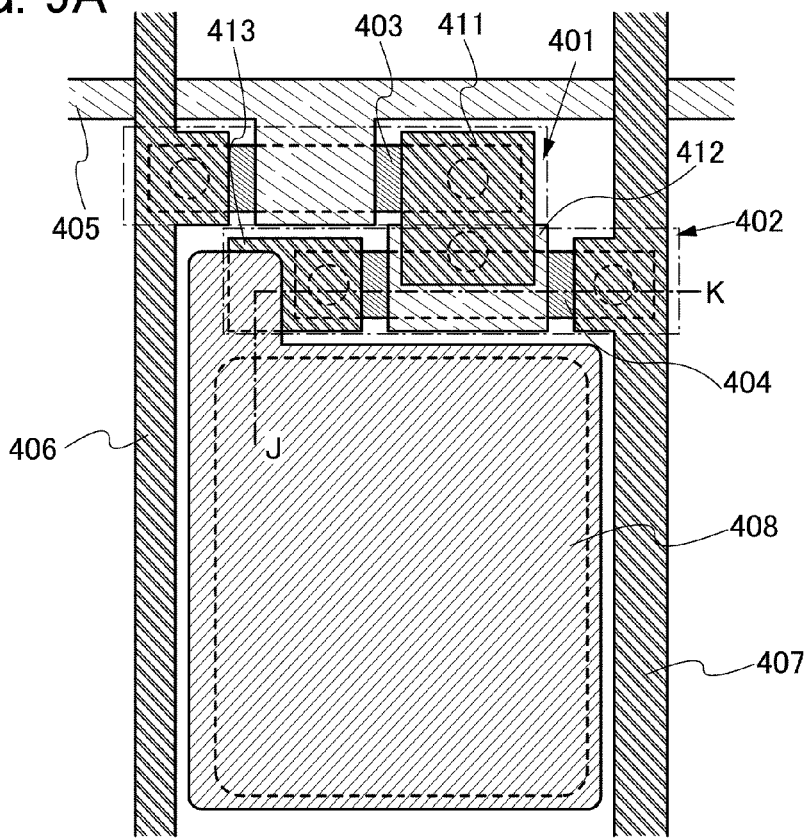
FIGS. 9A and 9B are a diagram showing an example of a display device in which an SOI substrate is used.
Figure 9B:
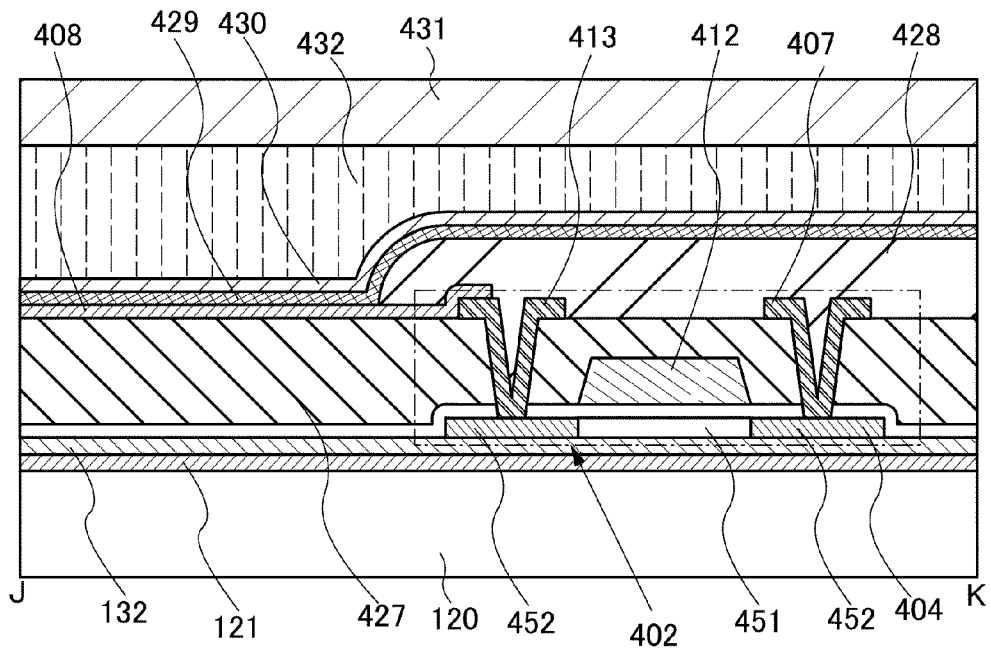

Next, an electroluminescent display device (hereinafter, referred to as an EL display device) is described with reference to FIGS. 9A and 9B. FIG. 9A is a plan view of a pixel of an EL display device and FIG. 9B is a cross-sectional view taken along a line J-K of FIG. 9A.

As illustrated in FIG. 9A, the pixel includes a selection transistor 401 and a display control transistor 402 each being a TFT, a scanning line 405, a signal line 406, a current supply line 407, and a pixel electrode 408. Each pixel is provided with a light-emitting element having a structure in which a layer including an electroluminescent material (this layer is also referred to as an EL layer) is sandwiched between a pair of electrodes. One electrode of the light emitting element is the pixel electrode 408. Further, a semiconductor layer 403 forms a channel formation region, a source region, and a drain region of the selection transistor 401. Further, a semiconductor layer 404 forms a channel formation region, a source region, and a drain region of the display control transistor 402. The semiconductor layers 403 and 404 are layers formed using the single crystal semiconductor layer 124 provided over the base substrate.

In the selection transistor 401, a gate electrode is included in the scanning line 405, one of a source electrode and a drain electrode is included in the signal line 406, and the other thereof is formed as an electrode 411. In the display control transistor 402, a gate electrode 412 is electrically connected to the electrode 411, one of a source electrode and a drain electrode is formed as an electrode 413 which is electrically connected to the pixel electrode 408, and the other thereof is included in the current supply line 407.

The display control transistor 402 is a p-channel TFT. As illustrated in FIG. 9B, a channel formation region 451 and p-type high-concentration impurity regions 452 are formed in the semiconductor layer 404. As an SOI substrate, an SOI substrate manufactured by the method according to the embodiment is used.

An interlayer insulating film 427 is formed to cover the gate electrode 412 of the display control transistor 402. The signal line 406, the current supply line 407, the electrode 411, the electrode 413, and the like are formed over the interlayer insulating film 427. In addition, over the interlayer insulating film 427, the pixel electrode 408 which is electrically connected to the electrode 413 is formed. A peripheral portion of the pixel electrode 408 is surrounded by a partition wall layer 428 having an insulating property. The EL layer 429 is formed over the pixel electrode 408, and a counter electrode 430 is formed over the EL layer 429. A counter substrate 431 is provided as a reinforcing plate and is fixed to the base substrate 120 by a resin layer 432.

The gray scale of the EL display device can be controlled by a current driving method in which luminance of a light-emitting element is controlled by current or a voltage driving method in which luminance of a light-emitting element is controlled by voltage. In the case where there is a large difference in the characteristic value between transistors of pixels, it is difficult to employ the current driving method; in order to employ the current driving method in such a case, a correction circuit which corrects characteristic variation is needed. When the EL display device is manufactured by a manufacturing method including a manufacturing process of an SOI substrate, the selecting transistor 401 and the display control transistor 402 do not have variation in electrical characteristics from pixel to pixel. Accordingly, the current drive method can be employed.

Namely, various electric appliances can be manufactured by using SOI substrates. The electronic devices include, in its category, cameras such as video cameras and digital cameras, navigation systems, audio reproducing devices (such as car audios or audio components), computers, game machines, portable information terminals (such as mobile computers, mobile phones, portable game machines, or e-books), and image reproducing devices having storage media (specifically, devices provided with display devices capable of playing audio data stored in recording media such as digital versatile disk (DVD) and displaying stored image data). An example of them is illustrated in FIGS. 10A to 10C.

Figure 10A:
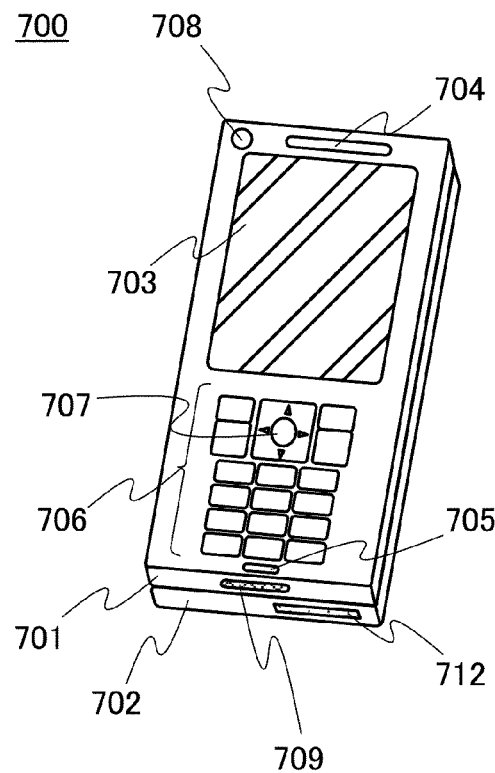
FIGS. 10A to 10C illustrate an electronic appliance in which an SOI substrate is used.
Figure 10B:
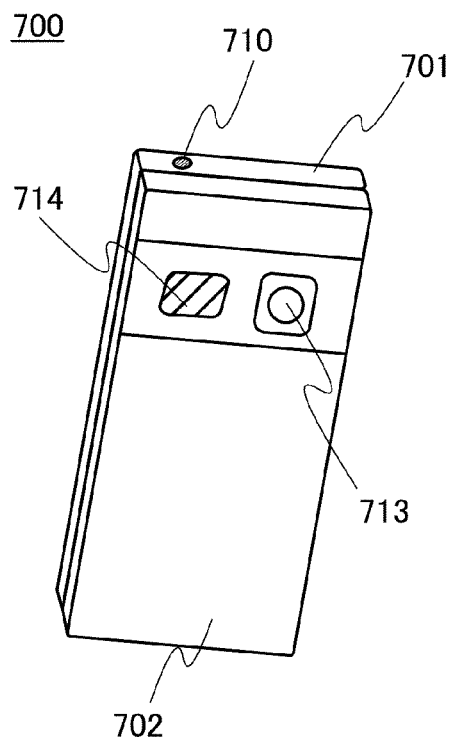
Figure 10C:
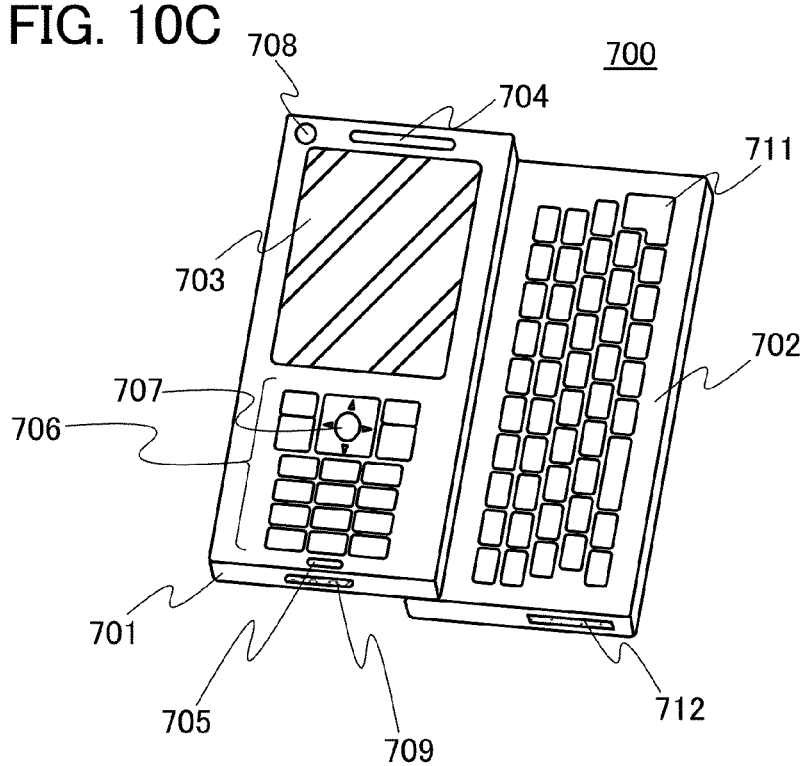

FIGS. 10A to 10C illustrate an example of a mobile phone to which the present invention is applied. FIG. 10A is a front view, FIG. 10B is a rear view, and FIG. 10C is a front view in which two housings are slid. A mobile phone 700 includes two housing 701 and 702. The mobile phone 700 has both functions of a mobile phone and a portable information terminal, and incorporates a computer. The mobile phone 700 is a "smartphone," with which a variety of data processing is possible in addition to telephone conversation.

The mobile phone 700 includes the housings 701 and 702. The housing 701 includes a display portion 703, a speaker 704, a microphone 705, operation keys 706, a pointing device 707, a front camera lens 708, an external connection terminal jack 709, an earphone terminal 710, and the like. The housing 702 includes a keyboard 711, an external memory slot 712, a rear camera 713, a light 714, and the like. In addition, an antenna is incorporated in the housing 701.

Further, in addition to the above structure, the mobile phone 700 may incorporate a non-contact IC chip, a small memory device, or the like.

The housings 701 and 702 which overlap with each other (see FIG. 10A) can be slid, and are slid to be developed as illustrated in FIG. 10C. The display panel or the display device that is manufactured according to any of the methods for manufacturing a thin film transistor in Embodiments 2 and 3 can be incorporated in the display portion 703. Since the front camera lens 708 is provided in the same plane as the display portion 703, the mobile phone can be used as a videophone. Further, a still image and a moving image can be taken with the rear camera 713 and the light 714, using the display portion 703 as a viewfinder.

With use of the speaker 704 and the microphone 705, the mobile phone 700 can be used as an audio recording device (recording device) or an audio reproducing device. With the use of the operation keys 706, further, operations of incoming and outgoing of calls, simple information input such as electronic mail, scrolling of a screen, cursor movement, and the like for selecting information to be displayed in the display portion, and the like are possible.

When much information needs to be treated in documentation, a use as a portable information terminal, and the like, it is convenient to use the keyboard 711. In addition, by sliding the housings 701 and 702 (see FIG. 10A) which overlap with each other, the housings 701 and 702 can be developed as shown in FIG. 10C. In the case where the mobile phone 700 is used as a portable information terminal, a cursor can be moved smoothly with the use of the keyboard 711 and the pointing device 707. The external connection terminal jack 709 can be connected to an AC adapter or a variety of cables such as a USB cable, and charging and data communication with a personal computer or the like is possible. Further, by inserting a recording medium in the external memory slot 712, a larger amount of data can be stored and transferred.

The rear face of the housing 702 (see FIG. 10B) is provided with the rear camera 713 and the light 714, and a still image and a moving image can be taken using the display portion 703 as a viewfinder.

Further, the mobile phone 700 may have an infrared communication function, a USB port, a function of receiving one segment television broadcast, a non-contact IC chip, an earphone jack, or the like, in addition to the aforementioned functions and structures.

The electric appliance illustrated in FIGS. 10A to 10C can be manufactured applying any of the aforementioned methods for manufacturing a transistor and a display device.

Note that the structure of the semiconductor device described in this embodiment can be implemented by being combined as appropriate with any one of structures described in other embodiments in this specification.

This application is based on Japanese Patent Application serial Nos. 2008-200001 and 2008-200016 filed with Japan Patent Office on Aug. 1, 2008, the entire contents of which are hereby incorporated by reference.

What is claimed is:

1. A method for manufacturing an SOI substrate comprising the steps of:
   irradiating a single crystal semiconductor substrate with accelerated ions to form an embrittlement region in the single crystal semiconductor substrate;
   bonding the single crystal semiconductor substrate and a base substrate together with an insulating layer interposed therebetween;

separating the single crystal semiconductor substrate at the embrittlement region to form a single crystal semiconductor layer over the base substrate with the insulating layer interposed therebetween; and irradiating a surface of the single crystal semiconductor layer with a laser beam under an inert atmosphere to melt at least a surface portion of the single crystal semiconductor layer to recrystallize the single crystal semiconductor layer, wherein an oxygen concentration in the single crystal semiconductor layer after the irradiation with the laser beam is less than $1 \times 10^{18}$ atoms/cm$^3$.

2. The method for manufacturing the SOI substrate according claim 1, wherein a nitrogen atmosphere or an argon atmosphere can be employed for the inert atmosphere.

3. The method for manufacturing the SOI substrate according to claim 1, wherein the irradiation with the laser beam is performed under a reduced pressure atmosphere.

4. The method for manufacturing the SOI substrate according to claim 1, wherein the melting of the single crystal semiconductor layer is partial melting.

5. The method for manufacturing the SOI substrate according to claim 1, wherein an oxygen concentration in the single crystal semiconductor layer is substantially equal or reduced after the irradiation with the laser beam comparing before the irradiation.

6. The method for manufacturing the SOI substrate according to claim 1, wherein a single crystal silicon substrate subjected to heat treatment at 1000° C. to 1250° C. inclusive under a reducing atmosphere is used for the single crystal semiconductor substrate.

7. The method for manufacturing the SOI substrate according to claim 1, wherein a glass substrate is used for the base substrate.

8. A method for manufacturing an SOI substrate, comprising the steps of:

irradiating a single crystal semiconductor substrate with an ion accelerated to form an embrittlement region in the single crystal semiconductor substrate;

bonding the single crystal semiconductor substrate and a base substrate together with an insulating layer interposed therebetween;

separating the single crystal semiconductor substrate at the embrittlement region to form a single crystal semiconductor layer over the base substrate with the insulating layer interposed therebetween; and irradiating a surface of the single crystal semiconductor layer with a laser beam in a chamber which is subjected to deoxidation treatment and set to an inert atmosphere to melt at least a surface portion of the single crystal semiconductor layer to recrystallize the single crystal semiconductor layer.

9. The method for manufacturing the SOI substrate according to claim 8, wherein treatment using a silane gas or a hydrogen gas is performed on the chamber as the deoxidation treatment.

10. The method for manufacturing the SOI substrate according to claim 8, wherein a double chamber is used as the chamber.

11. The method for manufacturing the SOI substrate according to claim 8, wherein a nitrogen atmosphere or an argon atmosphere is employed for the inert atmosphere.

12. The method for manufacturing an SOI substrate according to claim 8, wherein an oxygen concentration in the inert atmosphere is less than 1 ppb.

13. The method for manufacturing the SOI substrate according to claim 8, wherein the irradiation with the laser beam is performed under a reduced pressure atmosphere.

14. The method for manufacturing the SOI substrate according to claim 8, wherein the melting of the single crystal semiconductor layer is partial melting.

15. The method for manufacturing the SOI substrate according to claim 8, wherein an oxygen concentration in the single crystal semiconductor layer is substantially equal or reduced after the irradiation with the laser beam comparing before the irradiation.

16. The method for manufacturing the SOI substrate according to claim 8, wherein an oxygen concentration in the single crystal semiconductor layer after the irradiation with the laser beam is less than $1 \times 10^{18}$ atoms/cm$^3$.

17. The method for manufacturing the SOI substrate according to claim 8, wherein a single crystal silicon substrate subjected to heat treatment at 1000° C. to 1250° C. inclusive under a reducing atmosphere is used for the single crystal semiconductor substrate.

18. The method for manufacturing the SOI substrate according to claim 8, wherein a glass substrate is used for the base substrate.

19. A method for manufacturing an SOI substrate, comprising the steps of:

irradiating a single crystal semiconductor substrate with an ion accelerated to form an embrittlement region in the single crystal semiconductor substrate;

bonding the single crystal semiconductor substrate and a base substrate together with an insulating layer interposed therebetween;

separating the single crystal semiconductor substrate at the embrittlement region to form a single crystal semiconductor layer over the base substrate with the insulating layer interposed therebetween; and irradiating a surface of the single crystal semiconductor layer with a laser beam in a chamber which is subjected to deoxidation treatment and set to an inert atmosphere to melt at least a surface portion of the single crystal semiconductor layer to recrystallize the single crystal semiconductor layer, wherein a depth of the melted portion of the single semiconductor layer formed by irradiation with the laser beam is shallower than the thickness of the single crystal semiconductor layer.

20. The method for manufacturing the SOI substrate according to claim 19, wherein treatment using a silane gas or a hydrogen gas is performed on the chamber as the deoxidation treatment.

21. The method for manufacturing the SOI substrate according to claim 19, wherein a double chamber is used as the chamber.

22. The method for manufacturing the SOI substrate according to claim 19, wherein a nitrogen atmosphere or an argon atmosphere is employed for the inert atmosphere.

23. The method for manufacturing an SOI substrate according claim 19, wherein an oxygen concentration in the inert atmosphere is less than 1 ppb.

24. The method for manufacturing the SOI substrate according to claim 19, wherein the irradiation with the laser beam is performed under a reduced pressure atmosphere.

25. The method for manufacturing the SOI substrate according to claim 19, wherein the melting of the single crystal semiconductor layer is partial melting.

26. The method for manufacturing the SOI substrate according to claim 19, wherein an oxygen concentration in the single crystal semiconductor layer is substantially equal or reduced after the irradiation with the laser beam comparing before the irradiation.

27. The method for manufacturing the SOI substrate according to claim 19, wherein an oxygen concentration in the single crystal semiconductor layer after the irradiation with the laser beam is less than $1 \times 10^{18}$ atoms/cm$^3$.

28. The method for manufacturing the SOI substrate according to claim 19, wherein a single crystal silicon substrate subjected to heat treatment at 1000° C. to 1250° C. inclusive under a reducing atmosphere is used for the single crystal semiconductor substrate.

29. The method for manufacturing the SOI substrate according to claim 19, wherein a glass substrate is used for the base substrate.

* * * * *